(12) United States Patent
Dibbad et al.

(10) Patent No.: US 11,829,172 B2
(45) Date of Patent: Nov. 28, 2023

(54) POWER MANAGEMENT CIRCUIT INCLUDING ON-BOARD CURRENT SENSING ACROSS INDUCTOR AND ON-DIE CURRENT LIMIT DETECTION CIRCUIT

(71) Applicant: QUALCOMM Incorporated, San Diego, CA (US)

(72) Inventors: Vijayakumar Ashok Dibbad, Bangalore (IN); Fredrick Bontemps, Cary, NC (US); Matthew Severson, Austin, TX (US); Timothy Zoley, Raleigh, NC (US)

(73) Assignee: QUALCOMM INCORPORATED, San Diego, CA (US)

( * ) Notice: Subject to any disclaimer, the term of this patent is extended or adjusted under 35 U.S.C. 154(b) by 16 days.

(21) Appl. No.: 17/679,811

(22) Filed: Feb. 24, 2022

(65) Prior Publication Data
US 2023/0266782 A1    Aug. 24, 2023

(51) Int. Cl.
*G05F 1/62* (2006.01)
*G05F 1/56* (2006.01)
*G01R 19/165* (2006.01)

(52) U.S. Cl.
CPC ......... *G05F 1/56* (2013.01); *G01R 19/16571* (2013.01); *G05F 1/62* (2013.01)

(58) Field of Classification Search
None
See application file for complete search history.

(56) References Cited

U.S. PATENT DOCUMENTS

| | | | | |
|---|---|---|---|---|
| 8,698,469 | B1* | 4/2014 | Latham, II | H02M 1/15 323/283 |
| 9,000,745 | B2* | 4/2015 | Shi | H02M 1/08 323/282 |
| 9,800,144 | B2* | 10/2017 | Li | H02M 3/156 |
| 10,797,595 | B2* | 10/2020 | Yonezawa | H02M 3/158 |
| 10,831,254 | B2* | 11/2020 | Priyadarshi | G06F 1/3206 |
| 2012/0139519 | A1 | 6/2012 | Dearborn | |
| 2019/0346878 | A1 | 11/2019 | Gendler et al. | |
| 2021/0134771 | A1* | 5/2021 | Betsui | H02M 1/14 |
| 2021/0173419 | A1 | 6/2021 | Severson et al. | |

FOREIGN PATENT DOCUMENTS

WO    2021194474 A1    9/2021

OTHER PUBLICATIONS

Parisi C., "Multiphase Buck Design From Start to Finish (Part 1)," Texas Instruments, Application Report, SLVA882B, Apr. 2017, pp. 1-19.
International Search Report and Written Opinion—PCT/US2023/061928—ISA/EPO—dated May 23, 2023.

* cited by examiner

*Primary Examiner* — Thomas J. Hiltunen
(74) *Attorney, Agent, or Firm* — Loza & Loza, LLP

(57) ABSTRACT

An aspect of the disclosure relates to an apparatus including: an integrated circuit (IC) including one or more cores, and a current limit detection circuit; a voltage regulator; an inductor coupled between the voltage regulator and the one or more cores of the IC; and a current sensing circuit including inputs coupled across the inductor and an output coupled to the current limit detection circuit of the IC.

23 Claims, 8 Drawing Sheets

POWER MANAGEMENT CIRCUIT INCLUDING ON-BOARD CURRENT SENSING ACROSS INDUCTOR AND ON-DIE CURRENT LIMIT DETECTION CIRCUIT

FIELD

Aspects of the present disclosure relate generally to integrated circuits (ICs), and in particular, to an apparatus including a printed circuit board (PCB) and an integrated circuit (IC), such as a system on chip (SOC) type IC, with a power management circuit having on-board circuit for current sensing across an inductor and on-die current limit managing.

DESCRIPTION OF RELATED ART

Power or current limit management for circuits is of concern to maintain safe and reliable operations of the circuits. An integrated circuit (IC), such as a system on chip (SOC), may include one or more cores, such as signal processing cores, that may be drawing power or current from an off-chip power or supply voltage rail in performing its or their intended operations. In some situations, the power or current drawn by the one or more cores may exceed one or more safety limits. If such safety limits are exceeded, the IC may experience a malfunction, or even worse, irreparable damage. Thus, monitoring the power or current drawn by an IC is of interests.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

An aspect of the disclosure relates to an apparatus. The apparatus includes an integrated circuit (IC), including one or more cores, and a current limit detection circuit; a voltage regulator; an inductor coupled between the voltage regulator and the one or more cores of the IC; and a current sensing circuit including inputs coupled across the inductor and an output coupled to the current limit detection circuit of the IC.

Another aspect of the disclosure relates to a method. The method includes sensing a first voltage across an inductor coupled between a voltage regulator and one or more cores of an integrated circuit (IC); providing the first voltage to the IC; and controlling a current flowing through the inductor and to the one or more cores of the IC based on the first voltage.

Another aspect of the disclosure relates to an apparatus. The apparatus includes means for sensing a first voltage across an inductor coupled between a voltage regulator and one or more cores of an integrated circuit (IC); means for providing the first voltage to the IC; and means for controlling a current flowing through the inductor and to the one or more cores of the IC based on the first voltage.

Another aspect of the disclosure relates to an artificial intelligence (AI) inference apparatus. The AI inference apparatus includes an integrated circuit (IC) including a current limit detection circuit and one or more artificial intelligence (AI) inference data processing cores; a voltage regulator; an inductor coupled between the voltage regulator and the one or more AI inference data processing cores of the IC; and a current sensing circuit including inputs coupled across the inductor and an output coupled to the current limit detection circuit of the IC.

To the accomplishment of the foregoing and related ends, the one or more embodiments include the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the description embodiments are intended to include all such aspects and their equivalents.

DETAILED DESCRIPTION

Figure 1:
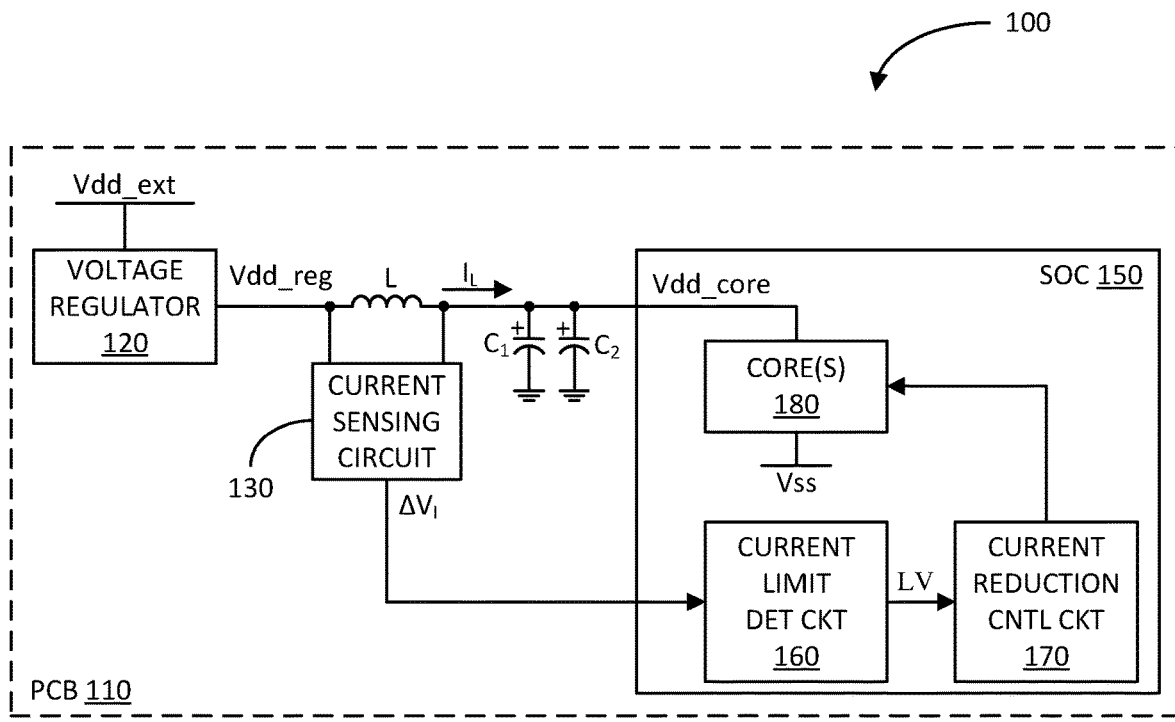
FIG. 1 illustrates a block diagram of an example power management circuit with an on-board inductor current sensor and on-die current limit detection circuit in accordance with an aspect of the disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Management of power or current drawn by circuits is of concern to ensure reliable performance of the circuits and reduce the likelihood of failure of the circuits. Generally, the more power or current drawn by a circuit, the hotter the circuit operates. At some point, if the power or current drawn by the circuit is not properly managed, the temperature of the circuit may reach a point where the circuit is likely to fail.

In managing power or current drawn by a circuit, there are several aspects of the current that are of concern. These aspects include transient peak current and sustained or static current. A current that peaks above a defined limit may cause permanent damage to a circuit or affect circuit performance, such as timing errors including setup and hold time violations in critical paths. When a transient peak current exceeds the capability of a voltage regulator, the regulator voltage may dip (out of the specified voltage regulator range); and thus, the circuit could malfunction, e.g., hardware or software failures; some of which may be recoverable, but undesirable, nonetheless. Thus, power or current management should monitor transient peak current and take appropriate actions to reduce the peak current if it exceeds a defined limit.

A sustained or static power or current, which is defined as power or current above a threshold limit and over a threshold time interval ("current-time limit"), may also cause damage to a circuit. This is because the operating temperature of a circuit is a function of the energy density of the circuit, which is related to the consumed power over time. If the sustained current exceeds the current-time limit, the temperature of the circuit may exceed the junction temperature, which may lead to damage to the circuit. The sustained current limit is generally lower than the transient peak current limit, and there may be several current limits associated with different time intervals or a continuous limit curve over time. Accordingly, power or current management should monitor sustained or static current and take appropriate actions to reduce the sustained or static current if it exceeds one or more defined limits.

Desirable characteristics of power or current management include a relatively large dynamic range, accuracy, response time, low loss, and small power delivery network (PDN) impedance. A power or current management circuit should have a relatively wide dynamic range in sensing current from relatively low to relatively high currents (e.g., an eight times (8×) dynamic range). If a small sense resistor of five (5) milliOhms (me) is used for low power dissipation purpose, the 8× dynamic range translates to five (5) milli Volt (mV) to 40 mV. Above 40 mV, the accuracy of the current measurement may be impacted due to nonlinearity or other issues. Below five (5) mV, the accuracy of the current measurement may be impacted due to noise affecting the relatively low voltages.

With regard to response time, a power or current management circuit should respond relatively fast when transient peak or static current limits are exceeded. This is so that the current exceeding such limits does not cause damage before the power or current management circuit is able to respond to the limit violations. As an example, a response time associated with supply rail current limit violations may be on the order of 200 to 500 nanoseconds (ns). Response time associated with board current limit violations should be on the order of 1 to 5 microseconds (µs).

As mentioned, other considerations for a power or current management circuit are relatively low loss and low PDN impedance. For example, a current-sensing resistor may provide good results in terms of achieving the desired current sensing dynamic range and accuracy, but the good results may come at the expense of power dissipation or IR losses across the current-sensing resistor. Also, the current-sensing resistor introduces additional PDN impedance, which generally has the adverse effects of producing higher transient voltages on the supply rail for circuits.

FIG. 1 illustrates a block diagram of an exemplary power management circuit 100 in accordance with an aspect of the disclosure. The power management circuit 100 includes an integrated circuit (IC) 150, such as a system on chip (SOC), mounted on a printed circuit board (PCB) 110. The SOC 150 may include one or more core(s) 180, which serve as examples of at least a portion of the IC (e.g., circuit(s) or load(s) (e.g., central processing units (CPUs), digital signal processors (DSP), etc.)) that draws current from a supply rail Vdd_core. The power management circuit 100 manages the current drawn by the core(s) 180 to lower the current if one or more power or current limits are violated.

In this regard, the power management circuit 100 includes off-chip components including a voltage regulator 120, an associated inductor L, a current sensing circuit 130, and one or more decoupling capacitors $C_1$ and $C_2$ (e.g., two (2), but could be more), all of which may be mounted on the PCB 110. The SOC 150 further includes a current limit detection circuit 160 and a current reduction control circuit 170. The voltage regulator 120, which may be implemented as a switched-mode power supply (SMPS) voltage regulator, includes an input coupled to a supply rail to receive an external supply voltage Vdd_ext (e.g., from a battery or a wall outlet via a transformer/rectifier), and an output to produce a regulated voltage Vdd_reg. The inductor L is coupled between the output of the voltage regulator 120 and the supply rail Vdd_core for the core(s) 180 of the SOC 150. The one or more decoupling capacitors $C_1$ and $C_2$ are coupled between the supply rail Vdd_core and a lower voltage rail, such as ground.

The current sensing circuit 130 includes inputs coupled across the inductor L, and an output coupled to the current limit detection circuit 160 of the SOC 150. As discussed in more detail herein, the current sensing circuit 130 generates a current-sense voltage $\Delta V_I$ related (e.g., substantially proportional) to a load current $I_L$ flowing through the inductor L. The load current $I_L$ is substantially the current drawn by the core(s) 180 of the SOC 150. The inductor L has an intrinsic resistance $R_L$ across which the voltage $\Delta V_I$ is developed based on the load current $I_L$. If the load current $I_L$ is a static current, the voltage $\Delta V_I$ is merely the IR voltage drop across the intrinsic resistance $R_L$ of the inductor L. If the load current $I_L$ is a transient current, the voltage $\Delta V_I$ across the inductor L is related to the intrinsic (ideal) inductance $L_L$ of the inductor L, its intrinsic resistance $R_L$, and a resistor and capacitor of the current sensing circuit 130 as discussed further herein.

Also, as discussed in more detail herein, the current limit detection circuit 160 receives the current-sense voltage $\Delta V_I$, and processes the voltage $\Delta V_I$ (e.g., amplifies/filters, converts it into a digital signal, and corrects the digital signal for component tolerances and temperature variation), compares the digital signal to one or more limits (e.g., peak current limit, sustained current limits, etc.), and generates a limit violation (LV) signal indicative of whether there are any limit violations, and the nature of the violations if any. The current reduction control circuit 170 responds to the LV signal if it indicates one or more power or current limit violations. For example, the current reduction control circuit 170 may be a clock control unit, which reduces a frequency of a clock supplied to the one or more core(s) 180. As the amount of power or current drawn by the core(s) 180 depends on the frequency of the clock, reducing the clock frequency results in a reduction of the power or current drawn by the core(s) 180. The current reduction control circuit 170 may implement the current reduction in other manners, such as operating the one or more core(s) 180 in a lower power mode, disabling one or more of the core(s) 180 or portion thereof, and/or other manners.

There are several advantages with regard to the power management circuit 100. For example, the sensing of the current $I_L$ drawn by the one or more core(s) 180 is substantially lossless or low loss. This is due to the current $I_L$ being sensed by the intrinsic resistance $R_L$ of the inductor L, which is generally relatively small compared to a current-sensing resistor. Further, the relatively low intrinsic resistance $R_L$ of the inductor L results in a relatively low PDN impedance, which generally reduces the magnitude of transient voltages and currents. Additionally, since the current-sense voltage $\Delta V_I$ is provided to the current limit detection circuit 160 of the SOC 150, the current limit detection circuit 160 may respond relatively fast to current limit violations to reduce malfunction and/or irreparable damage to the SOC 150.

Figure 2:
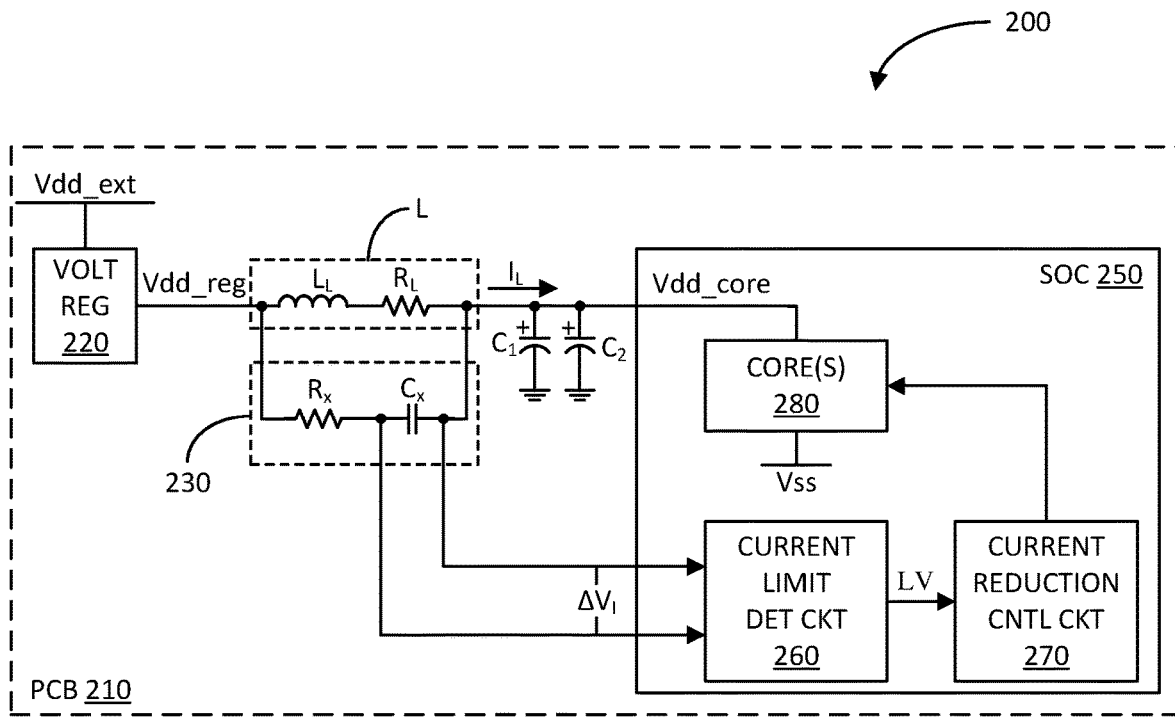
FIG. 2 illustrates a block diagram of another example power management circuit with an on-board inductor current sensor and on-die current limit detection circuit in accordance with another aspect of the disclosure.

FIG. 2 illustrates a block diagram of another example power management circuit 200 in accordance with another aspect of the disclosure. The power management circuit 200 is similar to that of power management circuit 100, but includes an example detailed implementation of the current sensing circuit 130. For example, the power management circuit 200 includes a voltage regulator 220 (e.g., an SMPS voltage regulator), an inductor L, one or more decoupling capacitors $C_1$ and $C_2$, and an integrated circuit (IC), such as a system on chip (SOC) 250, all of which may be mounted on a printed circuit board (PCB) 210. Similarly, the SOC 250 includes a current limit detection circuit 260, a current reduction control circuit 270, and one or more core(s) 280. These elements of the power management circuit 200 have been discussed in detail with respect to the corresponding elements of power management circuit 100.

For explanation purposes, the inductor L of power management circuit 200 has been equivalently decomposed into its intrinsic inductance $L_L$ and intrinsic resistance $R_L$. The current sensing circuit 230, which may also be mounted on the PCB 210, includes a resistor $R_x$ coupled in series with a capacitor $C_x$, both of which are coupled in parallel with the inductor L. The current sensing circuit 230 generates the current-sense voltage $\Delta V_I$ across the capacitor $C_x$.

With regard to static current $I_L$ sensing, the intrinsic inductance $L_L$ of the inductor L, the resistor $R_x$ and capacitor $C_x$ of the current sensing circuit 230 do not significantly affect the current-sense voltage $\Delta V_I$. That is, the current-sense voltage $\Delta V_I$ is substantially the same as the voltage across the intrinsic resistance $R_L$ of the inductor L, as there is substantially no static current flow through the resistor $R_x$ due to the capacitor $C_x$ and a high input impedance of the current limit detection circuit 260, as discussed further herein. As the voltage across the intrinsic resistance $R_L$ of the inductor L is related (e.g., substantially proportional) to the static current $I_L$, the current-sense voltage $\Delta V_I$ is also related (e.g., substantially proportional) to the static current $I_L$.

With regard to transient current $I_L$ sensing, the time constant of the current sensing circuit 230, which is the resistance of resistor $R_x$ multiplied by the capacitance of capacitor $C_x$ (e.g., $R_xC_x$) is made to be substantially equal to the time constant associated with the inductor L, which is the intrinsic inductance $L_L$ divided by the intrinsic resistance $R_L$ (e.g., $L_L/R_L$). In such case, the current-sense voltage $\Delta V_I$ across the capacitor $C_x$ is substantially equal to the voltage across the intrinsic resistance $R_L$ of the inductor L. For example, the alternating current (AC) voltage $V_{LAC}$ across the inductor L is the same as the voltage $V_{LAC}$ across the resistor $R_x$ and capacitor $C_x$. Accordingly, because of the voltage divider arrangement of resistor $R_x$ and capacitor $C_x$, the voltage $\Delta V_I$ across the capacitor $C_x$ may be given by the following equation:

$$\Delta V_I = \frac{V_{LAC}}{(R_X + X_{CX})} * X_{CX} \qquad \text{Eq. 1}$$

Where $X_{CX}$ is the impedance of the capacitor $C_x$, which may be represented as $1/sC_x$. The voltage $V_{LAC}$ across the inductor L may be given by the following equation:

$$V_{LAC}=I_{LAC}*(X_L+R_L)=I_{LAC}*(sL_L+R_L) \qquad \text{Eq. 2}$$

Where $I_{LAC}$ is the AC or transient current flowing through the inductor, $X_L$ is the impedance of the intrinsic inductor $L_L$ (which may be presented as $sL_L$), and $R_L$ is the intrinsic resistance of the inductor L. Substituting $V_{LAC}$ in Eq. 1 for $V_{LAC}$ given in Eq. 2, and using the s parameter associated with the capacitor $C_x$ and intrinsic inductance $L_L$, the following equation for the current-sense voltage $\Delta V_I$ is obtained:

$$\Delta V_I = \frac{I_{LAC}*(sL_L+R_L)}{\left(R_X + \frac{1}{sC_X}\right)} * \frac{1}{sC_X} \qquad \text{Eq. 3}$$

By rearranging Eq. 3, the following equation is obtained:

$$\Delta V_I = \frac{I_{LAC}*(sL_L+R_L)}{(R_XsC_X+1)/sC_X} * \frac{1}{sC_X} \qquad \text{Eq. 4}$$

The terms $sC_x$ being in the numerator and denominator in Eq. 4 cancels out so that the following equation is derived:

$$\Delta V_I = \frac{I_{LAC} * (sL_L + R_L)}{(R_X s C_X + 1)} \qquad \text{Eq. 5}$$

By rearranging the number of Eq. 5, the following equation is obtained:

$$\Delta V_I = (I_{LAC} * R_L) * \frac{\left(\frac{sL_L}{R_L} + 1\right)}{(R_X s C_X + 1)} \qquad \text{Eq. 6}$$

Thus, by making the time constant $L_L/R_L$ associated with the inductor L to be substantially equal to the time constant $R_x C_x$ associated with the current sensing circuit 230, the voltage $\Delta V_I$ across the capacitor $C_x$ is equal to the transient current $I_{LAC}$ multiplied by the intrinsic resistance $R_L$ of the inductor L. Thus, the voltage $\Delta V_I$ is related (e.g., substantially proportional) to the transient current $I_{LAC}$; the voltage $\Delta V_I$ being provided to the current limit detection circuit 260 for performing current limit management.

Figure 3A:
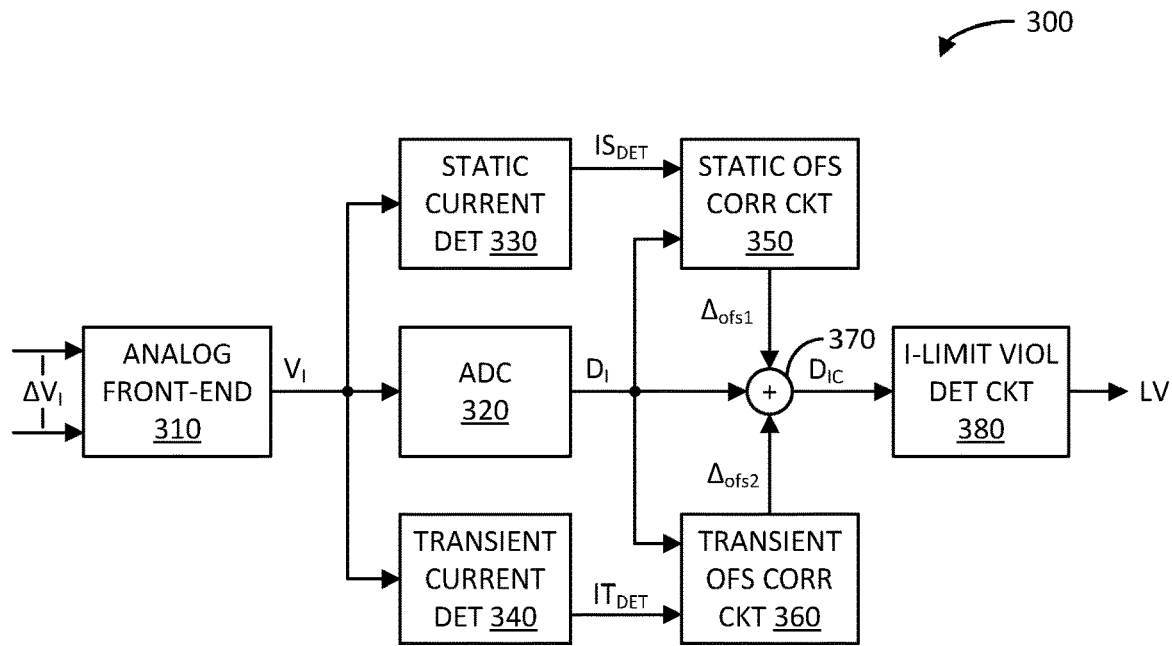
FIG. 3A illustrate a block diagram of an example on-die current limit detection circuit in accordance with another aspect of the disclosure.

FIG. 3A illustrate a block diagram of an example on-die current limit detection circuit 300 in accordance with another aspect of the disclosure. The on-die current limit detection circuit 300 may be an example detailed implementation of any one of the current limit detection circuits 160 and 260. In particular, the on-die current limit detection circuit 300 includes an analog front-end 310, an analog-to-digital converter (ADC) 320, a static current detector 330, a transient current detector 340, a static offset correction circuit 350, a transient offset correction circuit 360, a digital adder 370, and a current limit violation detection circuit 380.

The analog front-end 310 is configured to receive the current-sense voltage $\Delta V_I$, and generate a current-related voltage $V_I$ based on the current-sense voltage $\Delta V_I$. For example, the analog front-end 310 may be implemented as an instrumentation amplifier or differential amplifier configured to amplify the current-sense voltage $\Delta V_I$ to generate the current-related voltage $V_I$. The instrumentation amplifier or differential amplifier provides relatively high input impedance so that the analog front-end 310 does not significantly load the current sensing circuit 130 or 230 so that it does not adversely affect the current-sense voltage $\Delta V_I$ proportional relationship to the load current $I_L$. Additionally, the analog front-end 310 may include one or more filtering elements (e.g., an output shunt capacitor) to low pass filter and perform some averaging of the current-sense voltage $\Delta V_I$ to generate the current-related voltage $V_I$.

The ADC 320 is configured to convert the current-related voltage $V_I$ into a current-related digital signal $D_I$. The static current detector 330 is configured to receive and process the current-related voltage $V_I$ to generate a static current detection signal $IS_{DET}$ indicative of whether the current $I_L$ is a static current. For example, if the current-related voltage $V_I$ indicates that the current $I_L$ is relatively steady (e.g., $\Delta I_L/\Delta T$<threshold), then the static current detector 330 asserts the static current detection signal $IS_{DET}$. If, on the other hand, the current-related voltage $V_I$ indicates that the current $I_L$ is varying significantly (e.g., $\Delta I_L/\Delta T$>threshold), then the static current detector 330 deasserts the static current detection signal $IS_{DET}$. As discussed further herein, the state of the static current detection signal $IS_{DET}$ affects the offset applied to the current-related digital signal $D_I$ to correct for tolerance variation associated with the inductor L.

The transient current detector 340 is configured to receive and process the current-related voltage $V_I$ to generate a transient current detection signal $IT_{DET}$ indicative of whether the current $I_L$ is a transient current. For example, if the current-related voltage $V_I$ indicates that the current $I_L$ is varying significantly (e.g., $\Delta I_L/\Delta T$>threshold), then the transient current detector 340 asserts the static current detection signal $IT_{DET}$. If, on the other hand, the current-related voltage $V_I$ indicates that the current $I_L$ is relatively steady (e.g., $\Delta I_L/\Delta T$<threshold), then the transient current detector 340 deasserts the transient current detection signal $IT_{DET}$. Similarly, the state of the transient current detection signal $IT_{DET}$ affects the offset applied to the current-related digital signal $D_I$ to correct for tolerance variation associated with the inductor L and the current sensing circuit 230. Although the static and transient current detectors 330 and 340 are exemplified as separate components, it shall be understood that their functionalities may be implemented in an integrated circuit block.

As discussed in more detail, the static offset correction circuit 350 is configured to generate a first offset $\Delta_{ofs1}$ based on the current-related digital signal $D_I$ in response to an asserted static current detection signal $IS_{DET}$, and no first offset (e.g., $\Delta_{ofs1}$=0) in response to a deasserted static current detection signal $IS_{DET}$. The first offset $\Delta_{ofs1}$ is for correcting tolerance variation of the intrinsic resistance $R_L$ of the inductor L. As previously discussed, the current-sense voltage $\Delta V_I$ depends on the intrinsic resistance $R_L$ when the current $I_L$ is static. Thus, if the static current detection signal $IS_{DET}$ is asserted, the static offset correction circuit 350 generates the first offset $\Delta_{ofs1}$ in accordance with the following equation:

$$\Delta_{ofs1} = \frac{R_{Lnom} - R_{Ltol}}{R_{Lnom}} * D_I \qquad \text{Eq. 7}$$

Where $R_{Lnom}$ is the nominal or specified value of the intrinsic resistance $R_L$ of the inductor L, $R_{Ltol}$ is the measured value of the intrinsic resistance $R_L$ of the inductor L determined during, for example, a boot-up calibration procedure, and, as discussed, $D_I$ is the current-related digital signal.

Similarly, the transient offset correction circuit 360 is configured to generate a second offset $\Delta_{ofs2}$ based on the current-related digital signal $D_I$ in response to an asserted transient current detection signal $IT_{DET}$, and no second offset (e.g., $\Delta_{ofs2}$=0) in response to a deasserted transient current detection signal $IT_{DET}$. The second offset $\Delta_{ofs2}$ is for correcting tolerance variation of the intrinsic inductance $L_L$ and intrinsic resistance $R_L$ of the inductor L, the resistance of resistor $R_x$, and the capacitance of capacitor $C_x$ of the current sensing circuit 230. As previously discussed, the current-sense voltage $\Delta V_I$ is related (e.g., substantially proportional) to the transient current $I_L$ if the time constant $L_L/R_L$ associated with the inductor L is substantially equal to the time constant $R_x C_x$ associated with the current sensing circuit 230. If the time constants are not substantially equal due to tolerance variations of $L_L$, $R_L$, $R_x$ and $C_x$, the current-related digital signal $D_I$ may not accurately represent the transient current $I_L$. Thus, if the transient current detection signal $IT_{DET}$ is asserted, the transient offset correction circuit 360 generates the second offset $\Delta_{ofs2}$ in accordance with the following equation:

$$\Delta_{ofs2} = \frac{TC_{mismtch}}{TC_{nom}} * D_I \qquad \text{Eq. 8}$$

Where $TC_{nom}$ is the nominal or specified value of the time constant associated with the inductor L and current sensing circuit 230, $TC_{mismtch}$ is the measured mismatch or difference between the time constant $R_xC_x$ associated with the current sensing circuit 230 and the time constant $L_L/R_L$ associated with the inductor L, determined, for example, during a boot-up calibration procedure, and $D_I$ is the current-related digital signal. Although the static and transient offset correction circuits 350 and 360 are exemplified as separate components, it shall be understood that their functionalities may be implemented in an integrated circuit block.

The digital adder 370 is configured to add the first and second offsets $\Delta_{ofs1}$ and $\Delta_{ofs2}$ to the current-related digital signal $D_I$ to generate a tolerance-corrected current-related digital signal $D_{IC}$, which is a substantially accurate representation of the current $I_L$ (static or transient) drawn by the one or more core(s) 280 of the SOC 250. The current limit violation detection circuit 380 is configured to receive and process the tolerance-corrected current-related digital signal $D_{IC}$ to determine whether the current $I_L$ exceeds a certain static or transient current limit. If the current limit violation detection circuit 380 detects the current limit violation, the current limit violation detection circuit 380 asserts a limit violation (LV) signal indicating the current limit violation and the nature (static or transient) of the current limit violation. In response to the asserted limit violation (LV) signal, the current reduction control circuit 270 may perform some action to address the particular current limit violation (e.g., lower the frequency of one or more clocks driving the one or more core(s) 280, configure one or more core(s) 280 in a lower power mode, disable one or more core(s) 280 or portion thereof, etc.).

Figure 3B:
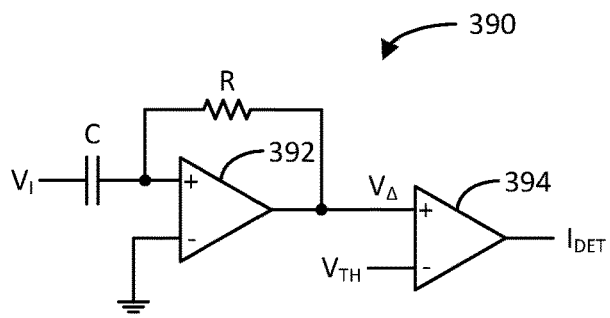
FIG. 3B illustrates a schematic diagram of an example current-type detector in accordance with another aspect of the disclosure.

FIG. 3B illustrates a schematic diagram of an example current-type detector 390 in accordance with another aspect of the disclosure. The current-type detector 390 may be an example of a combined implementation of the static current detector 330 and the transient current detector 340.

In particular, the current-type detector 390 includes a differentiator amplifier including an input capacitor C, an operational amplifier 392, and a feedback resistor R. The capacitor C is coupled between an input at which the current-related voltage $V_I$ is received and a first (e.g., positive) input of the operational amplifier 392. The feedback resistor R is coupled between an output and the first input of the operational amplifier 392. The operational amplifier 392 includes a second (e.g., negative), which may be coupled to ground or another reference voltage node. The current-type detector 390 further includes a comparator 394 including a first (e.g., positive) input coupled to the output of the differentiator (or more specifically, the output of the operational amplifier 392), a second (e.g., negative) input configured to receive a threshold voltage VTH, and an output to generate the current-type detection signal $I_{DET}$ (which corresponds to a combined $IS_{DET}/IT_{DET}$ signal).

In operation, if the current-related voltage $V_I$ relates to a static load current $I_L$, the differentiator (output of operational amplifier 392) generates a relatively low differentiated voltage $V_A$ because the static load current $I_L$ is not varying much. The differentiated voltage $V_A$ is applied to the positive input of the comparator 394. In this example, the differentiated voltage $V_A$ is less than the threshold voltage VTH applied to the negative input of the comparator 394. Accordingly, the comparator 394 generates the $I_{DET}$ signal at a low logic level, which indicates that the load current $I_L$ is static.

If the current-related voltage $V_I$ relates to a transient load current $I_L$, the differentiator (output of operational amplifier 392) generates a relatively high differentiated voltage $V_A$ because the transient load current $I_L$ is varying considerably. In this example, the differentiated voltage $V_A$ is greater than the threshold voltage VTH. Accordingly, the comparator 394 generates the $I_{DET}$ signal at a high logic level, which indicates that the load current $I_L$ is transient.

Figure 3C:
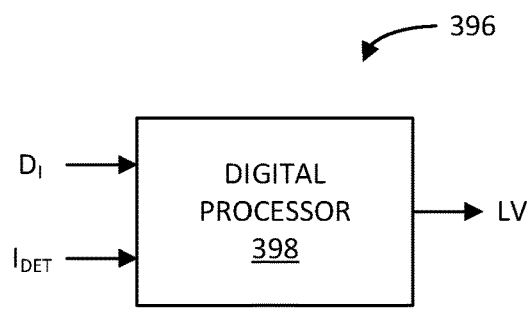
FIG. 3C illustrates a block diagram of an example digital processing circuit in accordance with another aspect of the disclosure.

FIG. 3C illustrates a block diagram of an example digital processing circuit 396 in accordance with another aspect of the disclosure. The digital processing circuit 396 may perform the digital operations of the static offset correction circuit 350, the transient offset correction circuit 360, the digital adder 370, and the current limit violation detection circuit 380. The digital processing circuit 396 may include a digital processor 398, which may be associated with a memory including instructions (e.g., code) for controlling the operation of the digital processor 398.

The digital processor 398 includes a first input to receive the current-related digital signal $D_I$ from the ADC 320, a second input to receive the current-type detection signal $I_{DET}$ (e.g., $IS_{DET}/IT_{DET}$) from the current-type detection circuit 380, and an output to generate the limit violation (LV) signal. Thus, the digital processor 398 is configured to apply an offset $\Delta_{ofs1}$ or $\Delta_{ofs2}$ to the digital signal $D_I$ for any tolerance deviation associated with the inductor L and/or the current sensing circuit 230 based on whether the current-type detection signal $I_{DET}$ indicates a static or transient load current $I_L$, respectively. The digital processor 398 is further configured to compare the corrected current-related signal $D_I$ to one or more thresholds to determine whether there are any current limit violations. Additionally, the digital processor 398 is configured to generate the LV signal based on the comparison.

Figure 4A:
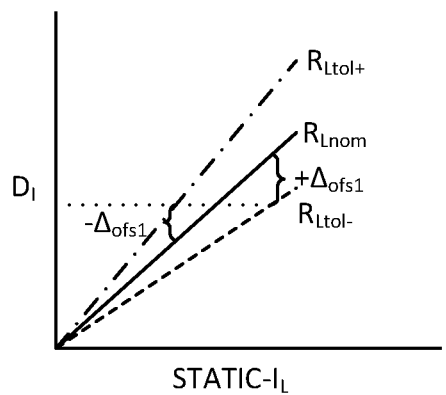
FIG. 4A illustrates a graph for pictorially explaining the generation of a static current offset $\Delta_{ofs1}$ based on tolerance variation of an intrinsic resistance of an inductor of a power management circuit in accordance with another aspect of the disclosure.

FIG. 4A illustrates a graph for pictorially explaining the generation of the first offset $\Delta_{ofs1}$ based on tolerance variation of the intrinsic resistance $R_L$ of the inductor L in accordance with another aspect of the disclosure. The horizontal axis of the graph represents the static load current $I_L$, and the vertical axis of the graph represents the current-related digital signal $D_I$. The solid response line of the graph represents the relationship between $D_I$ and $I_L$ when the intrinsic resistance $R_{Lnom}$ is at the nominal or specified value where no first offset $\Delta_{ofs1}$ is needed (e.g., $\Delta_{ofs1}=0$). The dashed response line of the graph represents the relationship between $D_I$ and $I_L$ when the measured intrinsic resistance $R_{Ltol-}$ is below the nominal or specified value $R_{Lnom}$ where a positive first offset $\Delta_{ofs1}$ is needed. And, the dash-dot response line of the graph represents the relationship between $D_I$ and $I_L$ when the measured intrinsic resistance $R_{Ltol+}$ is above the nominal or specified value $R_{Lnom}$ where a negative first offset $\Delta_{ofs1}$ is needed.

As the graph illustrates, if the current-related current signal $D_I$ is at a particular level (e.g., indicating a particular level for the load current $I_L$) represented by a horizontal dotted line, and the intrinsic resistance $R_{Lnom-}$ of the inductor L measured during a boot-up calibration procedure is below the nominal intrinsic resistance $R_{Lnom}$, the first offset voltage $\Delta_{ofs1}$ is the vertical difference between the $R_{Lnom}$ and the $R_{Lnom-}$ lines at the current-related current signal $D_I$ (e.g., a positive difference $+\Delta_{ofs1}$). Similarly, if the current-related current signal $D_I$, in this example, is at the same particular level represented by the horizontal dotted line, and the intrinsic resistance $R_{Lnom+}$ of the inductor L measured during a boot-up calibration procedure is above the nominal intrinsic resistance $R_{Lnom}$, the first offset voltage $\Delta_{ofs1}$ is the vertical difference between the $R_{Lnom}$ and the $R_{Lnom+}$ lines at the current-related current signal $D_I$ (e.g., a negative difference $-\Delta_{ofs1}$) As previously discussed, the first offset voltage $\Delta_{ofs1}$ may be determined in accordance with equation 7.

Figure 4B:
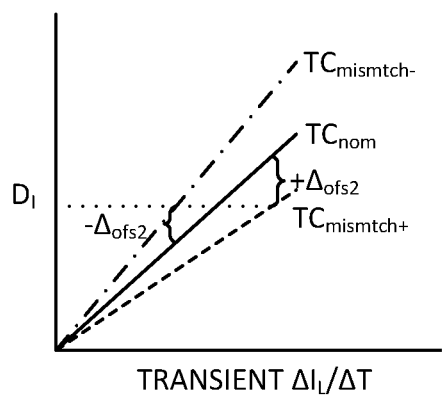
FIG. 4B illustrates a graph for pictorially explaining the generation of a transient current offset $\Delta_{ofs2}$ based on tolerance variation of intrinsic inductance and resistance of an inductor L, and resistor and capacitor of a current sensing circuit of a power management circuit in accordance with another aspect of the disclosure.

FIG. 4B illustrates a graph for pictorially explaining the generation of a second (transient current) offset $\Delta_{ofs2}$ based on tolerance variation of the intrinsic inductance $L_L$ and intrinsic resistance $R_L$ of the inductor L, and the resistance of resistor $R_x$ and capacitance of capacitor $C_x$ of the current sensing circuit 230 of the power management circuit 200 in accordance with another aspect of the disclosure. The horizontal axis of the graph represents the transient load current $\Delta I_L/\Delta T$ and the vertical axis of the graph represents the current-related digital signal $D_I$. The solid response line of the graph represents the relationship between $D_I$ and $\Delta I_L/\Delta T$ when there is no time constant mismatch $TC_{nom}$ between the inductor L and current sensing circuit 230, where no second offset $\Delta_{ofs2}$ is needed (e.g., $\Delta_{ofs2}=0$). The dashed response line of the graph represents the relationship between $D_I$ and $\Delta I_L/\Delta T$ when the time constant $R_x C_x$ of the current sensing circuit 230 is greater than the time constant $L_L/R_L$ of the inductor L (e.g., $TC_{mismtch+}=R_x C_x - L_L/R_L > 0$). And, the dash-dot response line of the graph represents the relationship between $D_I$ and $\Delta I_L/\Delta T$ when the time constant $R_x C_x$ of the current sensing circuit 230 is less than the time constant $L_L/R_L$ of the inductor L (e.g., $TC_{mismatch-}=R_x C_x - L_L/R_L < 0$).

As the graph illustrates, if the current-related current signal $D_I$ is at a particular level (e.g., indicating a particular average level for the transient load current $\Delta I_L/\Delta T$) represented by a horizontal dotted line, and the time constant mismatch is positive ($TC_{mismtch+}$) as measured during a boot-up calibration procedure, the second offset voltage $\Delta_{ofs2}$ is the vertical difference between the $TC_{nom}$ and the $TC_{mismtch+}$ lines at the current-related current signal $D_I$ (e.g., a positive difference $+\Delta_{ofs2}$). Similarly, if the current-related current signal $D_I$, in this example, is at the same particular level indicated by the horizontal dotted line, and the time constant mismatch is negative ($TC_{mismtch-}$) as measured during a boot-up calibration procedure, the second offset voltage $\Delta_{ofs2}$ is the vertical difference between the $TC_{nom}$ and the $TC_{mismatch-}$ lines at the current-related current signal $D_I$ (e.g., a negative difference $-\Delta_{ofs2}$). As previously discussed, the second offset voltage $\Delta_{ofs2}$ may be determined in accordance with equation 8.

Figure 5:
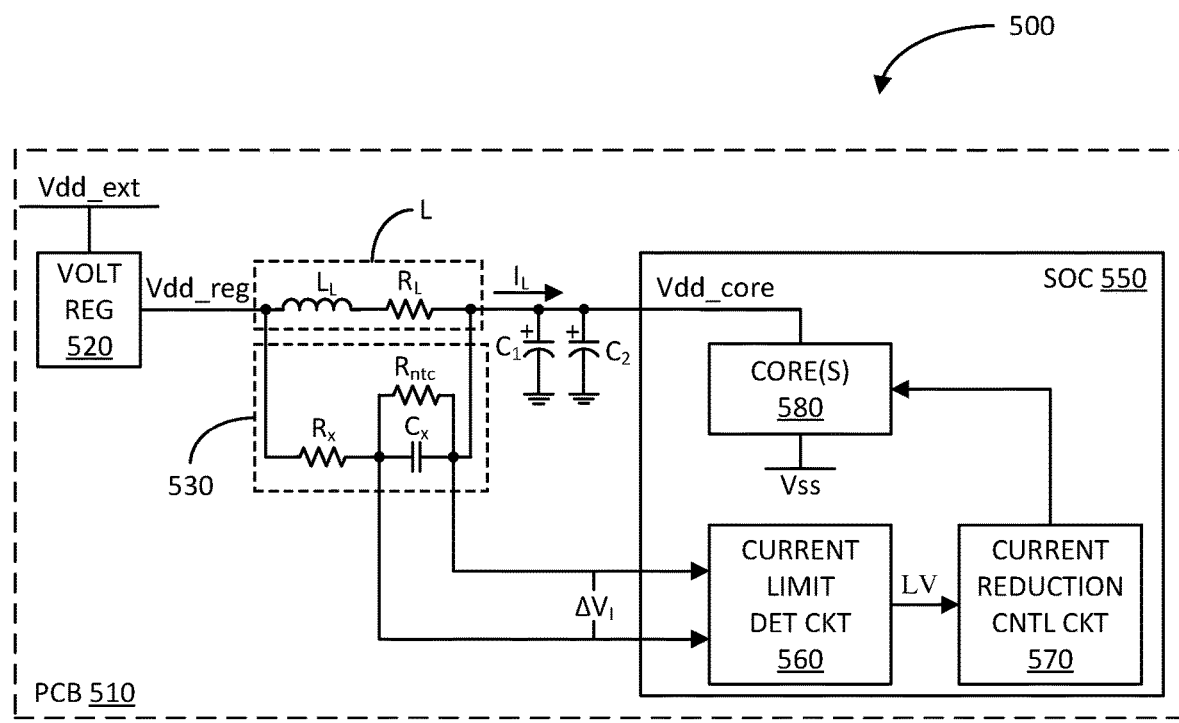
FIG. 5 illustrates a block diagram of another example power management circuit with an on-board inductor current sensor and on-die current limit detection circuit in accordance with another aspect of the disclosure.

FIG. 5 illustrates a block diagram of another example power management circuit 500 in accordance with another aspect of the disclosure. The power management circuit 500 is similar to that of power management circuit 200, but includes an example current sensing circuit configured to also compensate for temperature variation of the intrinsic resistance $R_L$ of the inductor L. For example, the power management circuit 500 includes a voltage regulator 520 (e.g., an SMPS voltage regulator), an inductor L, one or more decoupling capacitors $C_1$ and $C_2$, and an integrated circuit (IC), such as a system on chip (SOC) 550, all of which may be mounted on a printed circuit board (PCB) 510. Similarly, the SOC 550 includes a current limit detection circuit 560, a current reduction control circuit 570, and one or more core(s) 580. These elements of the power management circuit 500 have been discussed in detail with respect to the corresponding elements of power management circuits 100 and 200.

Similar to power management circuit 200, the inductor L of power management circuit 500 has been equivalently decomposed into its intrinsic (ideal) inductance $L_L$ and its intrinsic resistance $R_L$. Similarly, the current sensing circuit 230 includes a resistor $R_x$ coupled in series with a capacitor $C_x$, both of which are coupled in parallel with the inductor L. The current sensing circuit 530 generates the current-sense voltage $\Delta V_I$ across the capacitor $C_x$.

The inductor L typically includes a wire coil made out of a copper, other metal or metal alloy, or generally, an electrically-conductive material. As such, the intrinsic resistance $R_L$ varies in accordance with temperature. For example, if the inductor L is made out of copper, the intrinsic resistance $R_L$ has a positive temperature coefficient of +0.386 percent per degree Celsius (° C.). If there is no temperature compensation, then the current-sense voltage $\Delta V_I$ would also vary with temperature substantially in accordance with the temperature coefficient of the wire material of the inductor L.

Thus, to compensate the current-sense voltage $\Delta V_I$ for temperature variation, the current sensing circuit 530 further includes a resistive device $R_{ntc}$ to coupled in parallel with the capacitor $C_x$. The resistive device $R_{ntc}$ has a temperature coefficient substantially equal in magnitude but opposite in sign as the temperature coefficient of the intrinsic resistance $R_L$ of the inductor L. As an example, if the intrinsic resistance $R_L$ has a positive temperature coefficient of +0.386 percent per degree ° C., then the resistive device $R_{ntc}$ should have a temperature coefficient of substantially −0.386 percent per degree ° C. If, on the other hand, the intrinsic resistance $R_L$ has a negative temperature coefficient, then the resistive device $R_{ntc}$ should have a substantially equal but positive temperature coefficient. The addition of such resistive device $R_{ntc}$ makes the current-sense voltage $\Delta V_I$ substantially temperature independent.

Figure 6:
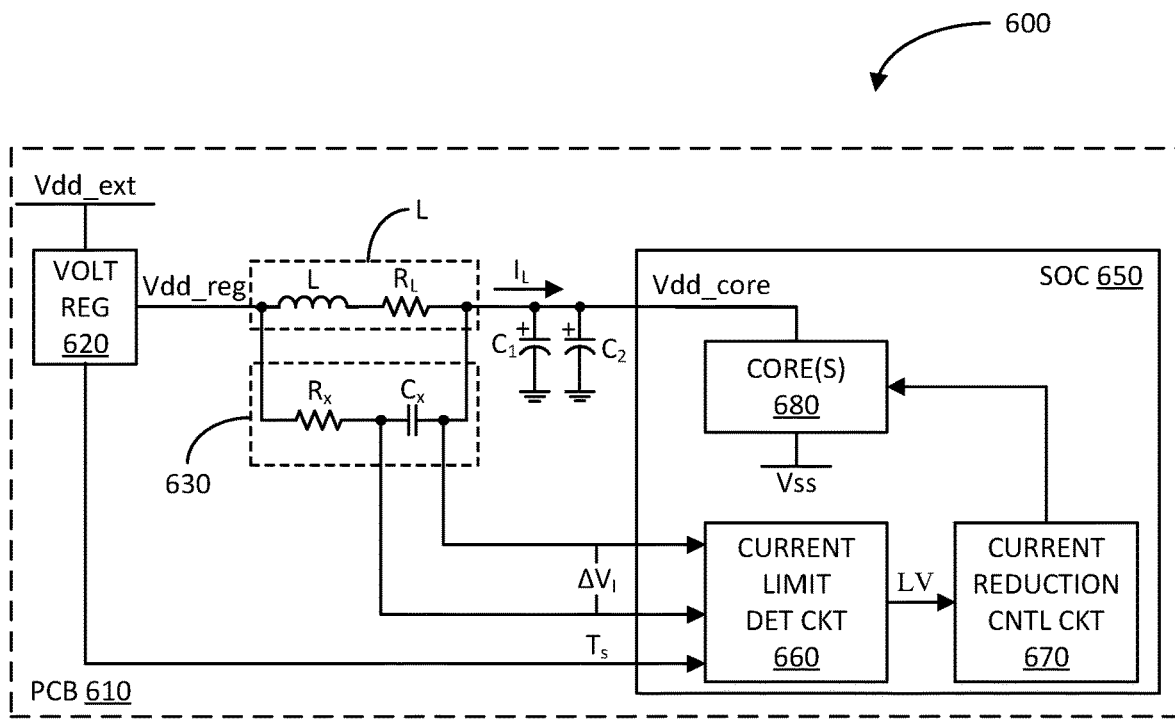
FIG. 6 illustrates a block diagram of another example power management circuit with an on-board inductor current sensor and on-die current limit detection circuit in accordance with another aspect of the disclosure.

FIG. 6 illustrates a block diagram of another example power management circuit 600 in accordance with another aspect of the disclosure. The power management circuit 600 is similar to that of power management circuit 200, but includes a voltage regulator configured to provide a temperature signal to a current limit detection circuit for temperature compensation purposes. For example, the power management circuit 600 includes a voltage regulator 620 (e.g., an SMPS voltage regulator), an inductor L, one or more decoupling capacitors $C_1$ and $C_2$, and an integrated circuit (IC), such as a system on chip (SOC) 650, all of which may be mounted on a printed circuit board (PCB) 610. Similarly, the SOC 650 includes a current limit detection circuit 660, a current reduction control circuit 670, and one or more core(s) 680. These elements of the power management circuit 600 have been discussed in detail with respect to the corresponding elements of power management circuits 100, 200, and 500.

Similar to power management circuits 200 and 500, the inductor L of power management circuit 600 may be equivalently decomposed to its intrinsic inductance $L_L$ and its intrinsic resistance $R_L$. Similarly, the current sensing circuit 630 includes a resistor $R_x$ coupled in series with a capacitor $C_x$, both of which are coupled in parallel with the inductor L. The current sensing circuit 630 generates the current-sense voltage $\Delta V_I$ across the capacitor $C_x$.

As discussed with reference to power management circuit 500, the inductor L typically includes a wire coil made out of a copper, other metal or metal alloy, or generally, an electrically-conductive material. Accordingly, as discussed, the intrinsic resistance $R_L$ of the inductor L varies in accordance with temperature. If there is no temperature compensation, then the current-sense voltage $\Delta V_I$ would also vary with temperature substantially in accordance with the temperature coefficient of the wire material of the inductor L. In this regard, the voltage regulator 620 includes an output to produce a temperature signal $T_S$ indicative of the temperature of the voltage regulator 620. Since the inductor L is typically placed in proximity to the voltage regulator 620, the temperature signal $T_s$ also provides an accurate indication of the temperature of the inductor L. As discussed in more detail further herein, the temperature signal output of the voltage regulator 620 is coupled to an input of the current limit detection circuit 660 to provide the latter the temperature signal $T_s$. The current limit detection circuit 660, in turn, compensates the current-related digital signal $D_I$ for temperature based on the temperature signal $T_s$.

Figure 7:
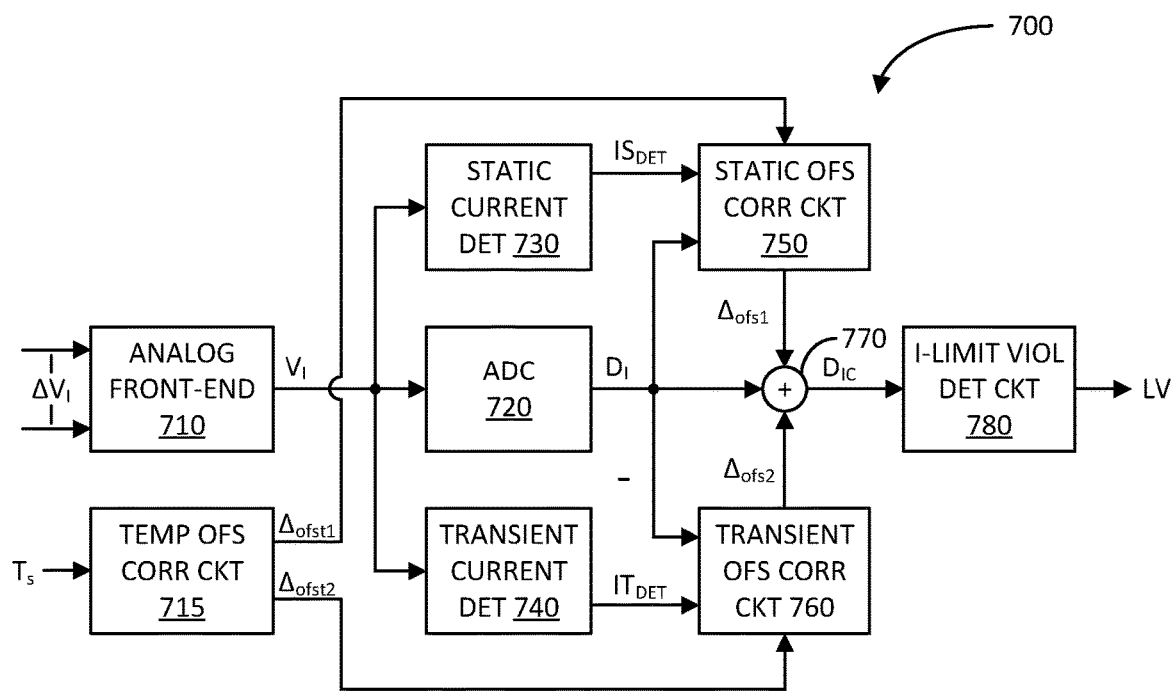
FIG. 7 illustrate a block diagram of another example on-die current limit detection circuit in accordance with another aspect of the disclosure.

FIG. 7 illustrate a block diagram of an example on-die current limit detection circuit 700 in accordance with another aspect of the disclosure. The on-die current limit detection circuit 700 may be an example detailed implementation of current limit detection circuit 660. In particular, the on-die current limit detection circuit 700 includes an analog front-end 710, an analog-to-digital converter (ADC) 720, a static current detector 730, a transient current detector 740, a static offset correction circuit 750, a transient offset correction circuit 760, a digital adder 770, and a current limit violation detection circuit 780. The aforementioned elements have been discussed in detail with respect to the corresponding elements of on-die current limit detection circuit 300.

The current limit detection circuit 700 further includes a temperature offset correction circuit 715 configured to receive the temperature signal $T_S$, for example, from a voltage regulator 620 of power management circuit 600. The temperature offset correction circuit 715 is configured to generate a first (static) temperature offset $\Delta_{ofst1}$ based on the temperature signal $T_s$. The temperature offset correction circuit 715 provides the first (static) temperature offset $\Delta_{ofst1}$ to the static offset correction circuit 750. The static offset correction circuit 750 modifies or adds the first (static) temperature offset $\Delta_{ofst1}$ to the first (static current) offset $\Delta_{ofs1}$.

As the static current $I_L$ varies only with the intrinsic resistance $R_L$ of the inductor L, the temperature offset correction circuit 715 generates the first (static) temperature offset $\Delta_{ofst1}$ such that it compensates the tolerance-corrected current-related digital signal $D_{IC}$ for temperature variation of the intrinsic resistance $R_L$ of the inductor L. As an example, if a positive temperature change causes the intrinsic resistance $R_L$ of the inductor L to rise by one (1) percent, the temperature offset correction circuit 715 generates the first (static) temperature offset $\Delta_{ofst1}$ to reduce the tolerance-corrected current-related digital signal $D_{IC}$ by substantially one (1) percent. Similarly, if a negative temperature change causes the intrinsic resistance $R_L$ of the inductor L to decrease by one (1) percent, the temperature offset correction circuit 715 generates the first (static) temperature offset $\Delta_{ofst1}$ to increase the tolerance-corrected current-related digital signal $D_{IC}$ by substantially one (1) percent.

The temperature offset correction circuit 715 is also configured to generate a second (transient) temperature offset $\Delta_{ofst2}$ based on the temperature signal $T_s$. The temperature offset correction circuit 715 provides the second (transient) temperature offset $\Delta_{ofst2}$ to the transient offset correction circuit 760. The transient offset correction circuit 760 modifies or adds the second (transient) temperature offset $\Delta_{ofst2}$ to the second (transient current) offset $\Delta_{ofs2}$.

As the transient current $I_L$ varies with the intrinsic inductance $L_L$ and intrinsic resistance $R_L$ of the inductor L, and the resistance of resistor $R_x$ and capacitance of capacitor $C_x$ of the current sensing circuit 630, the temperature offset correction circuit 715 generates the second (transient) temperature offset $\Delta_{ofst2}$ such that it compensates the tolerance-corrected current-related digital signal $D_{IC}$ for temperature variations of $L_L$, $R_L$, $R_x$, and $C_x$. As an example, if a positive temperature change causes the time constant $R_x C_x$ to increase by one (1) percent more than the time constant $L_L/R_L$, the temperature offset correction circuit 715 generates the second (transient) temperature offset $\Delta_{ofst2}$ to increase the tolerance-corrected current-related digital signal $D_{IC}$ by substantially one (1) percent. Similarly, if a negative temperature change causes the time constant $R_x C_x$ to decrease by one (1) percent more than the time constant $L_L/R_L$, the temperature offset correction circuit 715 generates the second (transient) temperature offset $\Delta_{ofst2}$ to decrease the tolerance-corrected current-related digital signal $D_{IC}$ by substantially one (1) percent.

With regard to power management circuits 500 and 600, and the current limit detection circuit 700, the aforementioned transient current temperature compensation may be optional if, for example, the inductor L is implemented as a high saturation current inductor and the capacitor $C_x$ is implemented as a multilayer ceramic COG capacitor, both of which have relatively low temperature coefficients. The resistor $R_x$ may also be implemented to have a relatively low temperature coefficient.

Figure 8:
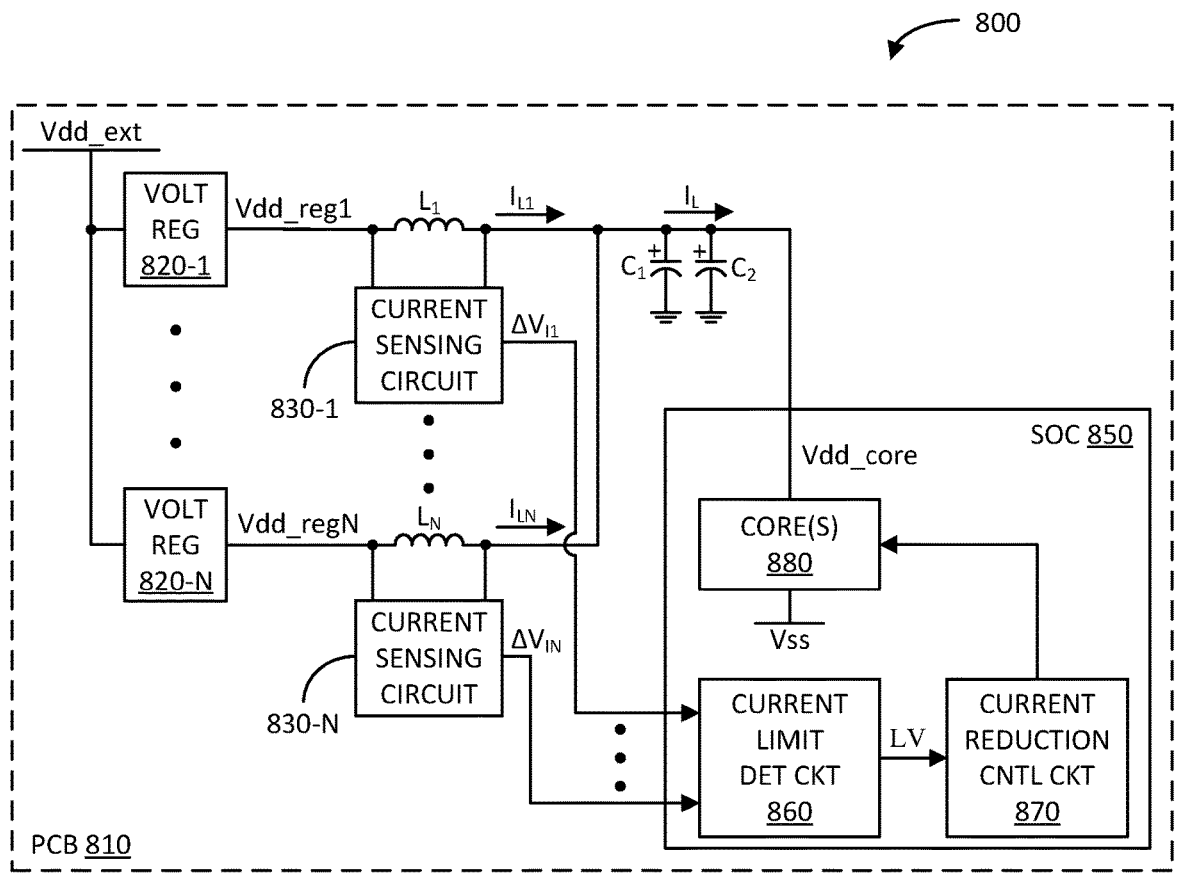
FIG. 8 illustrates a block diagram of another example power management circuit with a set of on-board inductor current sensors and an on-die current limit detection circuit in accordance with another aspect of the disclosure.

FIG. 8 illustrates a block diagram of another example power management circuit 800 in accordance with another aspect of the disclosure. The power management circuit 800 is similar to that of power management circuit 100, but includes a set of voltage regulators, a set of inductors L, and a set of current sensing circuits.

In particular, the power management circuit 800 includes a set of voltage regulators 820-1 to 820-N (e.g., where N is a positive integer, and each voltage regulator is implemented as an SMPS voltage regulator), a set of inductors $L_1$ to $L_N$, a set of current sensing circuits 830-1 to 830-N, one or more decoupling capacitors $C_1$ and $C_2$, and an integrated circuit (IC), such as a system on chip (SOC) 850, all of which may be mounted on a printed circuit board (PCB) 810. Similarly, the SOC 850 includes a current limit detection circuit 860, a current reduction control circuit 870, and one or more core(s) 880.

The set of voltage regulators 820-1 to 820-N are coupled to a supply rail to receive an external supply voltage Vdd_ext (e.g., from a battery, or wall outlet via a transformer/rectifier). The set of voltage regulators 820-1 to 820-N include a set of outputs to produce a set of regulated voltages Vdd_reg1 to Vdd_regN, respectively. The set of regulated voltages Vdd_reg1 to Vdd_regN are substantially pulses or square waves having different equally spaced phases. For example, if N is two (2), the phases of the set of regulated voltages Vdd_reg1 and Vdd_reg2 are 180 degrees apart. If N is three (3), the phases of the set of regulated voltages Vdd_reg1, Vdd_reg2, and Vdd_reg3 are 120 degrees apart. Generally, the phases of the set of N regulated voltages Vdd_reg1 to Vdd_regN are 360/N degrees apart.

The set of inductors $L_1$ to $L_N$ are coupled between the set of outputs of the voltage regulators 820-1 to 820-N and a supply rail Vdd_core for the one or more core(s) 880 of the SOC 850. The set of current sensing circuits 830-1 to 830-N include a set of inputs coupled across the set of inductors $L_1$ to $L_N$, respectively. The set of current sensing circuits 830-1 to 830-N include a set of outputs to produce a set of current-sense voltages $\Delta V_{I1}$ to $\Delta V_N$ related (e.g., substantially proportional) to a set of (static and transient) load currents $I_{L1}$ to $I_{LN}$ flowing through the set of inductors $L_1$ to $L_N$, respectively. The set of outputs of the current sensing circuits 830-1 to 830-N are coupled to a set of inputs of the current limit detection circuit 860, respectively. Each of the set of current sensing circuits 830-1 to 830-N may be implemented per current sensing circuit 230.

The sum of the set of load currents $I_{L1}$ to $I_{LN}$ flowing through the set of inductors $L_1$ to $L_N$ is the current $I_L$ supplied to the one or more core(s) 880 of the SOC 850. Accordingly, the sum of the set of current-sense voltages $\Delta V_{I1}$ to $\Delta V_N$ is also related (e.g., substantially proportional) to the current $I_L$ supplied to the one or more core(s) 880 of the SOC 850. Similarly, the one or more decoupling capacitors $C_1$ and $C_2$ are coupled between the Vdd_core supply rail and a lower voltage rail, such as ground.

As discussed in more detail further herein, the current limit detection circuit 860 receives the set of current-sense voltages $\Delta V_{I1}$ to $\Delta V_{IN}$, sums the set of current-sense voltages $\Delta V_{I1}$ to $\Delta V_{IN}$, processes the summed voltage (e.g., amplifies/filters, converts it into a digital signal, corrects the digital signal for component tolerances and optionally for temperature variation), compares the digital signal to one or more current limits (e.g., peak limit, sustained limits, etc.), and generates a limit violation (LV) signal indicative of whether there are any limit violations, and the nature of the violations if any. The current reduction control circuit 870 responds to the LV signal if it indicates one or more power or current limits violations. For example, the current reduction control circuit 870 may be a clock control unit, which reduces a frequency of a clock supplied to the one or more core(s) 880. As the amount of power or current drawn by the core(s) 880 depends on the frequency of the clock, reducing the clock frequency results in a reduction of the power or current drawn by the core(s) 880. The current reduction control circuit 870 may implement the current reduction in other manners, such as operating the one or more core(s) 880 in a lower power mode, disabling one or more of the core(s) 880 or portion thereof, and/or other manners.

Figure 9:
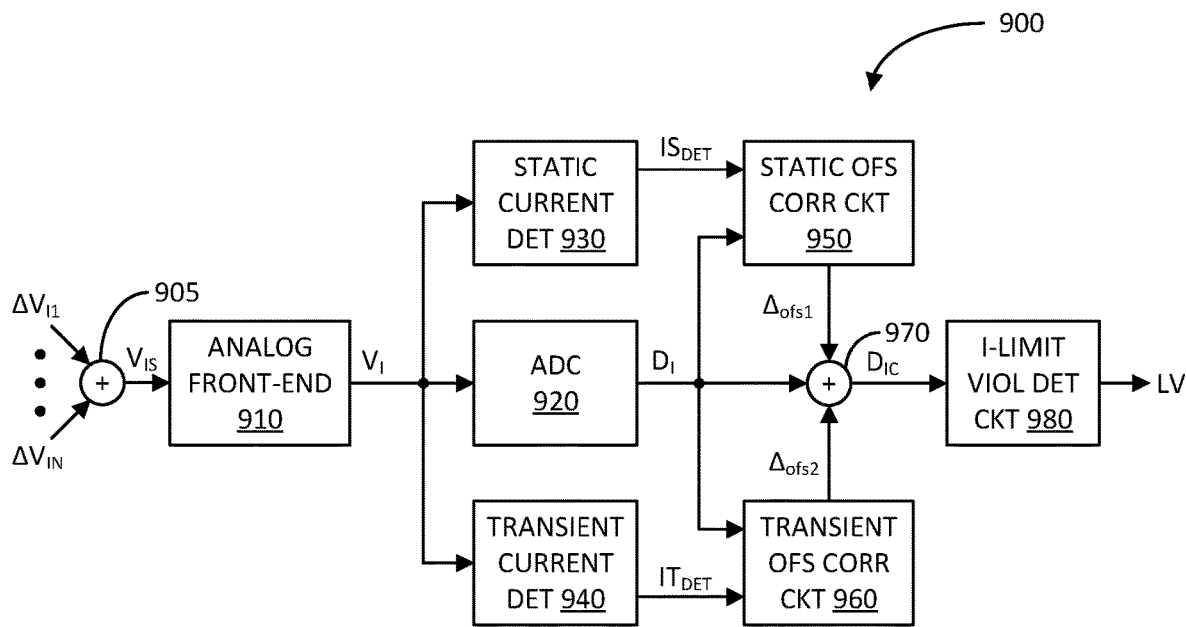
FIG. 9 illustrate a block diagram of another example on-die current limit detection circuit in accordance with another aspect of the disclosure.

FIG. 9 illustrate a block diagram of another example on-die current limit detection circuit 900 in accordance with another aspect of the disclosure. The on-die current limit detection circuit 900 may be an example detailed implementation of the current limit detection circuit 860. In particular, the on-die current limit detection circuit 900 includes a voltage summer 905, an analog front-end 910, an analog-to-digital converter (ADC) 920, a static current detector 930, a transient current detector 940, a static offset correction circuit 950, a transient offset correction circuit 960, a digital adder 970, and a current limit violation detection circuit 980. The aforementioned elements, with the exception of the voltage summer 905, have been discussed in detail with respect to the corresponding elements of on-die current limit detection circuit 300.

The voltage summer 905 includes a set of inputs coupled to the set of outputs of the current sensing circuits 830-1 to 830-N to receive the set of current-sense voltages $\Delta V_{I1}$ to $\Delta V_N$, respectively. The voltage summer 905 sums the set of current-sense voltages $\Delta V_{I1}$ to $\Delta V_N$ to generate a summed voltage $V_{IS}$ at an output. As previously discussed, the summed voltage $V_{IS}$ is related (e.g., substantially proportional) to the current $I_L$ supplied to the one or more core(s) 880 of the SOC 850. The output of the voltage summer 905 is coupled to an input of the analog front-end 910, which processes the summed voltage $V_{IS}$, in conjunction with the remaining components of the current limit detection circuit 900, to generate a current limit violation (LV) signal, similar to the operations of the corresponding components of the current limit detection circuit 300.

Although not shown with respect to power management circuit 800 and current limit detection circuit 900, it shall be understood that the temperature compensation techniques described with reference to power management circuits 500 and 600 and current limit detection circuit 700 may be implemented in power management circuit 800 and current limit detection circuit 900.

Figure 10:
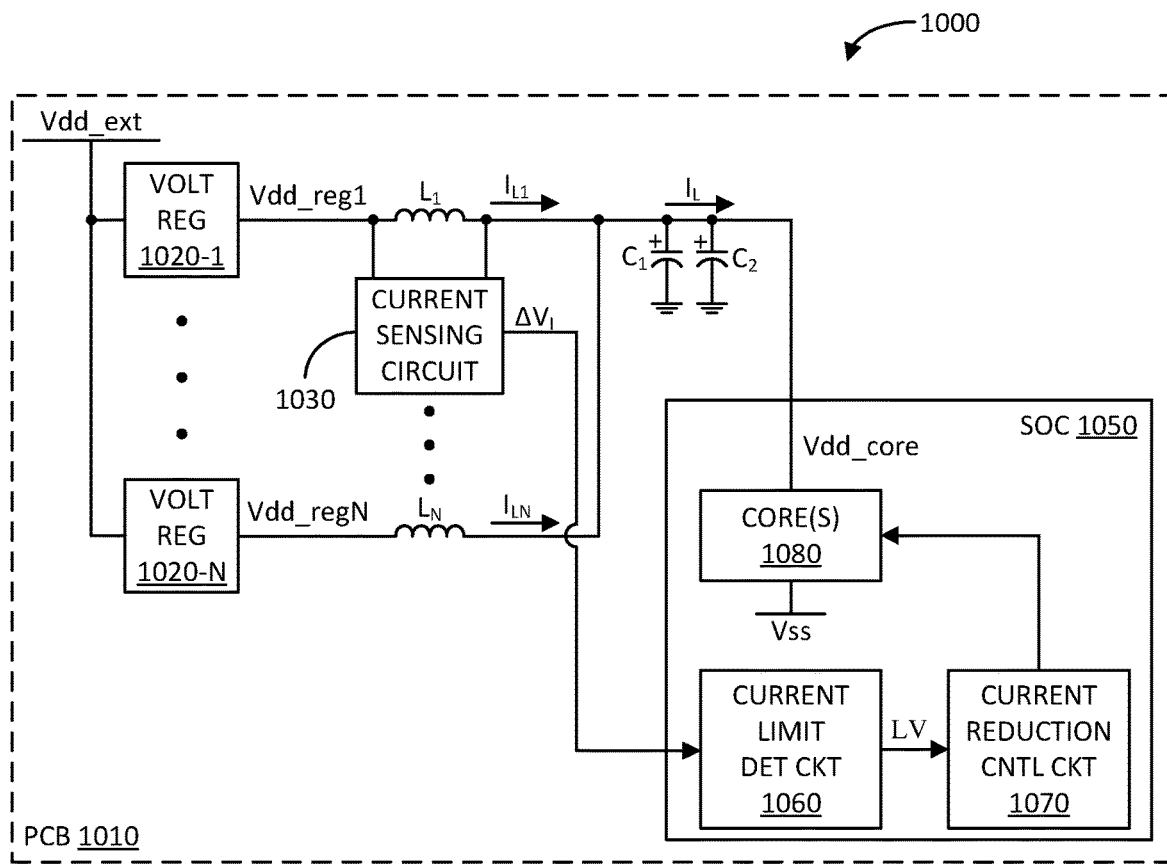
FIG. 10 illustrates a block diagram of another example power management circuit with a set of on-board inductor current sensors and an on-die current limit detection circuit in accordance with another aspect of the disclosure.

FIG. 10 illustrates a block diagram of another example power management circuit 1000 in accordance with another aspect of the disclosure. The power management circuit 1000 is similar to that of power management circuit 800, but instead of the set of N current sensing circuits 830-1 to 830-N, the power management circuit 1000 includes a single current sensing circuit, or more broadly, less than N current sensing circuits.

In particular, the power management circuit 1000 includes a set of voltage regulators 1020-1 to 1020-N (e.g., each implemented as an SMPS voltage regulator), a set of inductors $L_1$ to $L_N$, a current sensing circuit 1030, one or more decoupling capacitors $C_1$ and $C_2$, and an integrated circuit (IC), such as a system on chip (SOC) 1050, all of which may be mounted on a printed circuit board (PCB) 1010. Similarly, the SOC 1050 includes a current limit detection circuit 1060, a current reduction control circuit 1070, and one or more core(s) 1080.

The set of voltage regulators 1020-1 to 1020-N are coupled to a supply rail to receive an external supply voltage Vdd_ext (e.g., from a battery, or wall outlet via a transformer/rectifier). The set of voltage regulators 1020-1 to 1020-N include a set of outputs to produce a set of regulated voltages Vdd_reg1 to Vdd_regN cycling with different phases, respectively. The set of inductors $L_1$ to $L_N$ are coupled between the set of outputs of the voltage regulators 1020-1 to 1020-N and a supply rail Vdd_core for the one or more core(s) 1080 of the SOC 1050. The current sensing circuit 1030 includes inputs coupled across one of the set of inductors $L_1$ to $L_N$ (e.g., inductor $L_1$). The current sensing circuit 1030 includes an output to produce a current-sense voltage $\Delta V_I$ related (e.g., substantially proportional) to a (static and transient) load current $I_{L1}$ flowing through the $L_1$. In this implementation, the load currents $I_{L2}$ to $I_{LN}$ flowing through the remaining one or more inductors $L_2$ to $L_N$ are substantially equal to the current $I_{L1}$ flowing through the inductor $L_1$, respectively (e.g., for a balanced load current distribution).

The output of the current sensing circuit 1030 is coupled to an input of the current limit detection circuit 1060. The current sensing circuit 1030 may be implemented per current sensing circuit 230. The sum of the set of load currents $I_{L1}$ to $I_{LN}$ flowing through the set of inductors $L_1$ to $L_N$ is the current $I_L$ supplied to the one or more core(s) 1080 of the SOC 1050. Accordingly, the current-sense voltage $\Delta V_I$ is also related (e.g., substantially proportional) to 1/N times the current $I_L$ supplied to the one or more core(s) 1080 of the SOC 1050. Similarly, the one or more decoupling capacitors $C_1$ and $C_2$ are coupled between the Vdd_core supply rail and a lower voltage rail, such as ground.

As discussed in more detail further herein, the current limit detection circuit 1060 receives the current-sense voltage $\Delta V_I$, processes the current-sense voltage $\Delta V_I$ (e.g., amplifies/filters, converts it into a digital signal, and corrects the digital signal for component tolerances and optionally for temperature variation) to generate a tolerances and optionally temperature corrected current-related digital signal $D_{IC}$, multiplies the corrected current-related digital signal $D_{IC}$ by N to generate a total current-related digital signal $D_{TIC}$, compares the digital signal $D_{TIC}$ to one or more current limits (e.g., peak limit, sustained limits, etc.), and generates a limit violation (LV) signal indicative of whether there are any limit violations, and the nature of the violations if any.

The current reduction control circuit 1070 responds to the LV signal if it indicates one or more power or current limits violations. For example, the current reduction control circuit 1070 may be a clock control unit, which reduces a frequency of a clock supplied to the one or more core(s) 1080. As the amount of power or current drawn by the core(s) 1080 depends on the frequency of the clock, reducing the clock frequency results in a reduction of the power or current drawn by the core(s) 1080. The current reduction control circuit 1070 may implement the current reduction in other manners, such as operating the one or more core(s) 1080 in a lower power mode, disabling one or more of the core(s) 1080 or portion thereof, and/or other manners.

Figure 11:
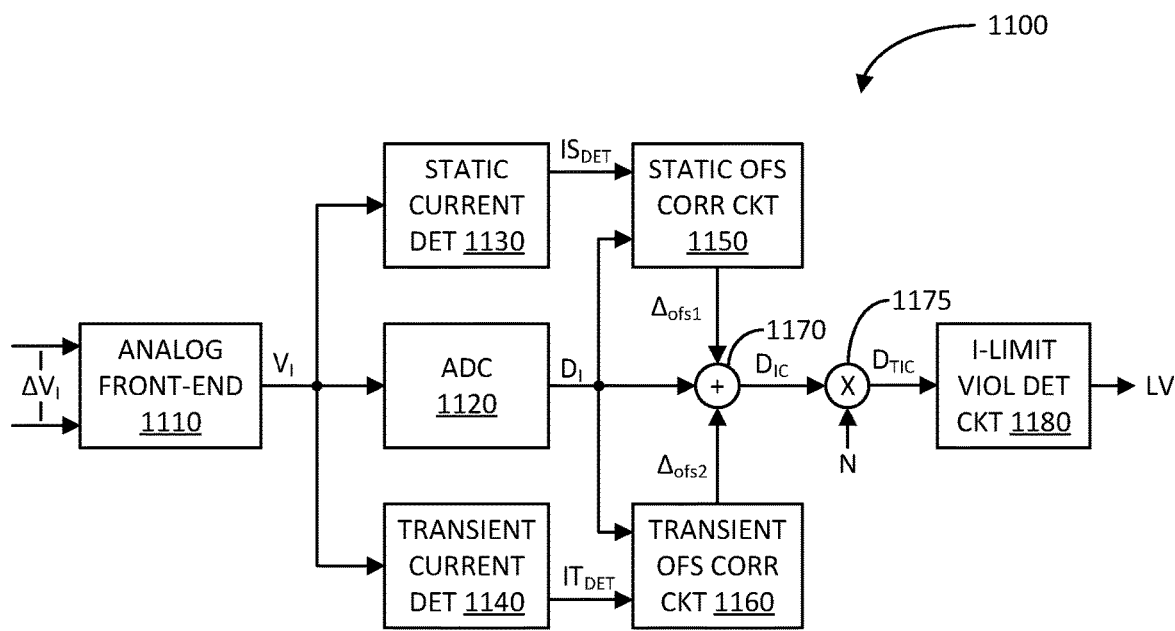
FIG. 11 illustrate a block diagram of another example on-die current limit detection circuit in accordance with another aspect of the disclosure.

FIG. 11 illustrate a block diagram of another example on-die current limit detection circuit 1100 in accordance with another aspect of the disclosure. The on-die current limit detection circuit 1100 may be an example detailed implementation of the current limit detection circuit 1060. In particular, the on-die current limit detection circuit 1100 includes an analog front-end 1110, an analog-to-digital converter (ADC) 1120, a static current detector 1130, a transient current detector 1140, a static offset correction circuit 1150, a transient offset correction circuit 1160, a digital adder 1170, and a current limit violation detection circuit 1180. The aforementioned elements have been discussed in detail with respect to the corresponding elements of on-die current limit detection circuit 300.

As, in this example, the current sensing is performed across a single inductor $L_1$, and it is assumed that the currents $I_{L1}$ to $I_{LN}$ are substantially equal to each other, the corrected current-related digital signal $D_{IC}$ generated by the digital adder 1170 is related to substantially 1/N of the load current $I_L$ supplied to the one or more core(s) 1080. Thus, to generate a digital signal that represents substantially the load current $I_L$ supplied to the one or more core(s) 1080, the current limit detection circuit 1100 further includes a multiplier 1175 including a first input coupled the output of the digital adder 1170, a second input configured to receive a multiplication factor of N, and an output to generate a total corrected current-related digital signal $D_{TTC}$. The output of the multiplier 1175 is coupled to the input of the current limit violation detection circuit 1180 to provide it the total corrected current-related digital signal $D_{TTC}$. The current limit violation detection circuit 1180 then generates the current limit violation (LV) signal based on the total corrected current-related digital signal $D_{TTC}$. If the number of current sensing circuits is more than one but less than N (e.g., M), then the multiplication factor provided to the second input of the multiplier 1175 is N/M.

Although not shown with respect to power management circuit 1000 and current limit detection circuit 1100, it shall be understood that the temperature compensation techniques described with reference to power management circuits 500 and 600 and current limit detection circuit 700 may be implemented in power management circuit 1000 and current limit detection circuit 1100.

Figure 12:
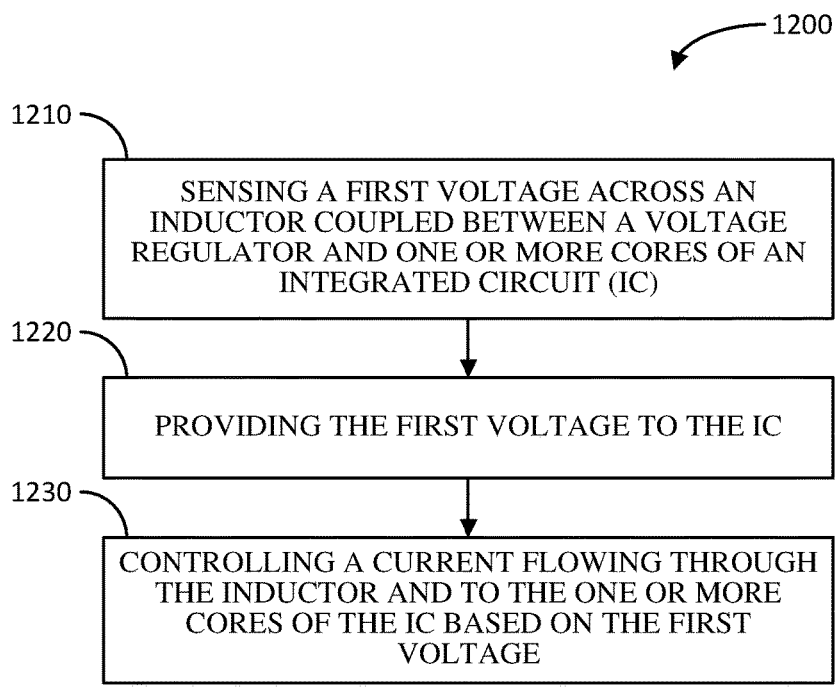
FIG. 12 illustrates a flow diagram of an example method of measuring/controlling a current drawn by an integrated circuit (IC) in accordance with another aspect of the disclosure.

FIG. 12 illustrates a flow diagram of an example method 1200 of measuring/controlling a current drawn by an integrated circuit (IC) in accordance with another aspect of the disclosure. The method 1200 includes sensing a first voltage across an inductor coupled between a voltage regulator and one or more cores of an integrated circuit (IC) (block 1210). Examples of means for sensing a first voltage across an inductor coupled between a voltage regulator and one or more cores of an integrated circuit (IC) include any one of the current sensing circuits described herein.

The method 1200 further includes providing the first voltage to the IC (block 1220). Examples of means for providing the first voltage to the IC include any of the electrical connections between a current sensing circuit and a current limit detection circuit described herein. Further, the method 1200 includes controlling a current flowing through the inductor and to the one or more cores of the IC based on the first voltage (block 1230). Examples of means for controlling a current flowing through the inductor and to the one or more cores of the IC based on the first voltage include any of the current limit detection circuits and current reduction control circuits described herein.

The sensing of the first voltage across the inductor per block 1210 of the method 1200 may include generating a second voltage across a capacitor coupled in series with a resistor, wherein the capacitor and the resistor are coupled in parallel with the inductor. Examples of means for generating a second voltage across a capacitor coupled in series with a resistor include any of the electrical connections of the resistor $R_x$ and capacitor $C_x$ across a corresponding inductor L or $L_1$ to $L_N$. The generating of the second voltage across the capacitor may include setting a first time constant associated with the resistor and capacitor to be substantially the same as a second time constant associated with the inductor.

The method 1200 may further include compensating the second voltage for variation of an intrinsic resistance of the inductor with temperature. An example of means for compensating the second voltage for variation of an intrinsic resistance of the inductor with temperature include the resistive device $R_{ntc}$ coupled across the capacitor $C_x$ in power management circuit 500.

The controlling of the current per block 1230 of the method 1200 may include amplifying the second voltage to generate a current-related voltage; converting the current-related voltage to a current-related digital signal; correcting the current-related digital signal for tolerance variation associated with at least one of an intrinsic resistance of the inductor, an intrinsic inductance of the inductor, a resistance of the resistor, and a capacitance of the capacitor; comparing the corrected current-related digital signal to one or more current limits; and reducing the current flowing to the one or more cores based on the comparison.

Examples of means for amplifying the second voltage to generate a current-related voltage include any one of the analog front-ends described herein. Examples of means for converting the current-related voltage to a current-related digital signal include any one of the analog-to-digital converters (ADCs) described herein. Examples of means for correcting the current-related digital signal for tolerance variation associated with at least one of an intrinsic resistance of the inductor, an intrinsic inductance of the inductor, a resistance of the resistor, and a capacitance of the capacitor include any of the static current detectors, any of the static offset correction circuits, any of the transient current detectors, and any of the transient offset correction circuits described herein. Examples of means for comparing the corrected current-related digital signal to one or more current limits include any of the limit violation detection circuits described herein. Examples of means for reducing the current flowing to the one or more cores based on the comparison include any one of the current reduction control circuits described herein.

The controlling of the current per block 1230 of the method 1200 may include amplifying the second voltage to generate a current-related voltage; converting the current-related voltage to a current-related digital signal; correcting the current-related digital signal for variation of at least one of an intrinsic resistance of the inductor, an intrinsic inductance of the inductor, a resistance of a resistor, and a capacitance of a capacitor with temperature; comparing the corrected current-related digital signal to one or more current limits; and reducing the current flowing to the one or more cores based on the comparison.

Examples of means for amplifying the second voltage to generate a current-related voltage include any one of the analog front-ends described herein. Examples of means for converting the current-related voltage to a current-related digital signal include any one of the analog-to-digital converters (ADCs) described herein. Examples of means for correcting the current-related digital signal for variation of at least one of an intrinsic resistance of the inductor, an intrinsic inductance of the inductor, a resistance of a resistor, and a capacitance of a capacitor with temperature include the temperature offset correction circuit 715, the static current detector 730, the static offset correction circuit 750, the transient current detector 740, and the transient offset correction circuit 760 described herein. Examples of means for comparing the corrected current-related digital signal to one or more current limits include any of the limit violation detection circuits described herein. Examples of means for reducing the current flowing to the one or more cores based on the comparison include any one of the current reduction control circuits 1070 described herein.

Figure 13:
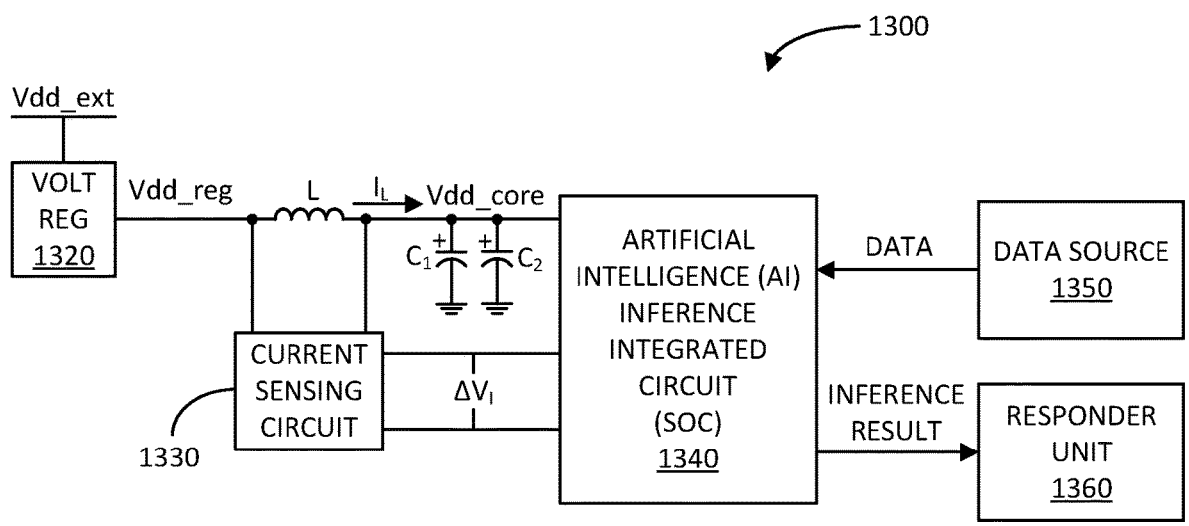
FIG. 13 illustrates a block diagram of an example artificial intelligence (AI) inference apparatus in accordance with another aspect of the disclosure.

FIG. 13 illustrates a block diagram of an example artificial intelligence (AI) inference apparatus 1300 in accordance with another aspect of the disclosure. The AI inference apparatus 1300 may take a form factor of a network edge server, data center server, desktop computer, laptop computer, smart phone, tablet device, Internet of Things (IoT), and other types of computing devices.

The AI inference apparatus 1300 includes an off-die voltage regulator 1320, inductor L, current sensing circuit 1330, and one or more decoupling capacitors $C_1$ and $C_2$. The AI inference apparatus 1300 further includes an integrated circuit (IC) 1340, such as a system on chip (SOC), which may include one or more AI inference data processing core(s). The voltage regulator 1320 is coupled to a supply rail to receive an external supply voltage Vdd_ext. The voltage regulator 1320 is configured to generate a regulated voltage Vdd_reg at an output. The inductor L is coupled between the output of the voltage regulator and a supply rail Vdd_core for the one or more AI inference data processing core(s) of the IC 1340. The current sensing circuit 1330 includes inputs coupled across the inductor L, and an output to generate a current-sense voltage $\Delta V_I$. The output of the current sensing circuit 1330 is coupled to the IC 1340.

The AI inference apparatus 1300 may be coupled to a data source 1350, which provides data to the one or more AI inference data processing core(s) of the IC 1340. The data source 1350 may be a database situated on a memory device, such as a hard drive, solid state drive, or other memory device, one or more sensors, and/or other device capable of generating data. The AI inference IC 1340 may receive the data from the data source 1350 via a data bus, local area network (LAN), wide area network (WAN), or other types of data communication mediums.

The one or more AI inference data processing core(s) of the AI inference IC 1340 processes the data received from the data source 1350 based on one or more models (e.g., generated via training session) to generate one or more inference results. For example, the data from the data source 1350 may be data related to inventory of items on shelves at a retail establishment. The one or more AI inference data processing core(s) of the AI inference IC 1340 may process the data to generate the inference result indicating when and which shelves to restock with the corresponding items. Considering another example, the data from data source 1350 may be traffic data at an intersection or road. The one or more AI inference data processing core(s) of the AI inference IC 1340 may process the data to generate the inference result indicating how to control the corresponding traffic light or traffic entrance onto a road for improved traffic flow. Although two examples are provided, it shall be understood that there are many other applications where AI inference processing are applicable.

The AI inference apparatus 1300 may also be coupled to a responder unit 1360, which receives the inference result generated by the one or more AI inference data processing core(s) of the AI inference IC 1340. The responder unit 1360 may be any type of control and/or computing device, which responds to the inference result generated by the one or more AI inference data processing core(s) of the AI inference IC 1340. Considering the above examples, the responder unit 1360 may be a computing device located at the retail establishment to indicate to a user (e.g., an employee) to restock the identified shelf or shelves with the corresponding items based on the inference result. Or, the responder unit 1360 may be traffic light unit at an intersection or entrance to a road to control the state of the traffic light based on the inference result. The inference result may be sent from the IC or SOC 1340 to the responder unit 1360 via a data bus, local area network (LAN), wide area network (WAN), or other types of data communication mediums.

Although AI inference processing may be an example application to which the power management techniques described herein is applicable, it shall be understood that the power management techniques described herein may be applicable to other applications, including power management for a MODEM chip of a wireless communication device or infrastructure product (e.g., base station), a vehicle or automotive control chip, as well as others.

The following provides an overview of aspects of the present disclosure:

Aspect 1: An apparatus, including: an integrated circuit (IC) including one or more cores, and a current limit detection circuit; a voltage regulator; an inductor coupled between the voltage regulator and the one or more cores of the IC; and a current sensing circuit including inputs coupled across the inductor and an output coupled to the current limit detection circuit of the IC.

Aspect 2: The apparatus of aspect 1, wherein the current sensing circuit includes a resistor coupled in series with a capacitor, wherein the resistor and the capacitor are coupled in parallel with the inductor.

Aspect 3: The apparatus of aspect 1 or 2, wherein the current limit detection circuit includes an analog front-end including inputs coupled across the capacitor.

Aspect 4: The apparatus of aspect 3, wherein the analog front-end includes an instrumentation amplifier or a differential amplifier.

Aspect 5: The apparatus of aspect 3 or 4, wherein the current limit detection circuit includes an analog-to-digital converter (ADC) including an input coupled to an output of the analog front-end.

Aspect 6: The apparatus of aspect 5, wherein the current limit detection circuit further includes: a static current detector including an input coupled to the output of the analog front-end; a static offset correction circuit including a first input coupled to an output of the static current detector, and a second input coupled to an output of the ADC; a digital adder including a first input coupled to the output of the ADC, and a second input coupled to an output of the static offset correction circuit; and a current limit violation detection circuit including an input coupled to an output of the digital adder.

Aspect 7: The apparatus of aspect 6, wherein the IC further includes a current reduction control circuit including an input coupled to an output of the current limit violation detection circuit and an output coupled to the one or more cores.

Aspect 8: The apparatus of any one of aspects 5-7, wherein the current limit detection circuit further includes: a transient current detector including an input coupled to the output of the analog front-end; a transient offset correction circuit including a first input coupled to an output of the transient current detector, and a second input coupled to an output of the ADC; a digital adder including a first input coupled to the output of the ADC, and a second input coupled to an output of the transient offset correction circuit; and a current limit violation detection circuit including an input coupled to an output of the digital adder.

Aspect 9: The apparatus of aspect 8, wherein the IC further includes a current reduction control circuit including an input coupled to an output of the current limit violation detection circuit and an output coupled to the one or more cores.

Aspect 10: The apparatus of any one of aspects 2-9, wherein the current sensing circuit further includes a resistive device coupled in parallel with the capacitor.

Aspect 11: The apparatus of aspect 10, wherein the resistive device has a temperature coefficient substantially equal in magnitude and opposite in sign as a temperature coefficient of an intrinsic resistance of the inductor.

Aspect 12: The apparatus of any one of aspects 1-11, wherein the voltage regulator includes a temperature signal output coupled to the current limit detection circuit of the IC.

Aspect 13: The apparatus of aspect 12, wherein the current limit detection circuit further includes: an analog front-end including inputs coupled to the current sensing circuit; an analog-to-digital converter (ADC) including an input coupled to an output of the analog front-end; a temperature offset correction circuit including an input coupled to the temperature signal output of the voltage regulator; a digital adder including a first input coupled to an output of the ADC, and a second input coupled to an output of the temperature offset correction circuit; and a current limit violation detection circuit including an input coupled to an output of the digital adder.

Aspect 14: The apparatus of aspect 13, wherein the IC further includes a current reduction control circuit including an input coupled to an output of the current limit violation detection circuit and an output coupled to the one or more cores.

Aspect 15: The apparatus of any one of aspects 1-14, further including: a set of voltage regulators including the voltage regulator; a set of inductors including the inductor, wherein the set of inductors are coupled between the set of voltage regulators and the one or more cores of the IC, respectively; and a set of current sensing circuits including a set of inputs coupled across the set of inductors, respectively, wherein the set of current sensing circuits includes a set of outputs coupled to the current limit detection circuit of the IC.

Aspect 16: The apparatus of aspect 15, wherein the current limit detection circuit includes: a voltage summer including inputs coupled to the set of outputs of the set of current sensing circuits; an analog front-end including an input coupled to an output of the voltage summer; an analog-to-digital converter (ADC) including an input coupled to an output of the analog front-end; and a current limit violation detection circuit including an input coupled to an output of the ADC.

Aspect 17: The apparatus of aspect 16, wherein the IC further includes a current reduction control circuit including an input coupled to an output of the current limit violation detection circuit and an output coupled to the one or more cores.

Aspect 18: The apparatus of any one of aspects 1-14, further including: a set of voltage regulators including the voltage regulator; a set of inductors including the inductor, wherein the set of inductors are coupled between the set of voltage regulators and the one or more cores of the IC, respectively; and at least one current sensing circuit including inputs coupled across at least one of the set of inductors, respectively, wherein the at least one current sensing circuit includes at least one output coupled to the current limit detection circuit of the IC.

Aspect 19: The apparatus of aspect 18, wherein the current limit detection circuit includes: an analog front-end including an input coupled to the at least one output of the at least one current sensing circuit, respectively; an analog-to-digital converter (ADC) including an input coupled to an output of the analog front-end; a multiplier including a first input coupled to an output of the ADC, and a second input configured to receive a multiplication factor; and a current limit violation detection circuit including an input coupled to an output of the multiplier.

Aspect 20: The apparatus of any one of aspects 1-19, wherein the IC is implemented as a system on chip (SOC) including the one or more cores and the current limit detection circuit, wherein the SOC is mounted on a printed circuit board (PCB), and wherein the voltage regulator, inductor, and current sensing circuit are off-chip components mounted on the PCB.

Aspect 21: A method, including: sensing a first voltage across an inductor coupled between a voltage regulator and one or more cores of an integrated circuit (IC); providing the first voltage to the IC; and controlling a current flowing through the inductor and to the one or more cores of the IC based on the first voltage.

Aspect 22: The method of aspect 21, wherein sensing the first voltage across the inductor includes generating a second voltage across a capacitor coupled in series with a resistor, wherein the capacitor and the resistor are coupled in parallel with the inductor.

Aspect 23: The method of aspect 22, wherein generating the second voltage across the capacitor includes setting a first time constant associated with the resistor and capacitor to be substantially the same as a second time constant associated with the inductor.

Aspect 24: The method of aspect 22 or 23, further including compensating the second voltage for variation of an intrinsic resistance of the inductor with temperature.

Aspect 25: The method of any one of aspects 22-24, wherein controlling the current includes: amplifying the second voltage to generate a current-related voltage; converting the current-related voltage to a current-related digital signal; correcting the current-related digital signal for tolerance variation associated with at least one of an intrinsic resistance of the inductor, an intrinsic inductance of the inductor, a resistance of the resistor, and a capacitance of the capacitor; comparing the corrected current-related digital signal to one or more current limits; and reducing the current flowing to the one or more cores based on the comparison.

Aspect 26: The method of any one of aspects 22-25, wherein controlling the current includes: amplifying the second voltage to generate a current-related voltage; converting the current-related voltage to a current-related digital signal; correcting the current-related digital signal for variation of at least one of an intrinsic resistance of the inductor, an intrinsic inductance of the inductor, a resistance of a resistor, and a capacitance of a capacitor with temperature; comparing the corrected current-related digital signal to one or more current limits; and reducing the current flowing to the one or more cores based on the comparison.

Aspect 27: An apparatus, including: means for sensing a first voltage across an inductor coupled between a voltage regulator and one or more cores of an integrated circuit (IC); means for providing the first voltage to the IC; and means for controlling a current flowing through the inductor and to the one or more cores of the IC based on the first voltage.

Aspect 28: The apparatus of aspect 27, wherein the means for sensing the first voltage across the inductor includes means for generating a second voltage across a capacitor coupled in series with a resistor, wherein the capacitor and the resistor are coupled in parallel with the inductor.

Aspect 29: The apparatus of aspect 28, wherein the means for controlling the current includes: means for amplifying the second voltage to generate a current-related voltage; means for converting the current-related voltage to a current-related digital signal; means for correcting the current-related digital signal for tolerance variation associated with at least one of an intrinsic resistance of the inductor, an intrinsic inductance of the inductor, a resistance of the resistor, and a capacitance of the capacitor; means for comparing the corrected current-related digital signal to one or more current limits; and means for reducing the current flowing to the one or more cores based on the comparison.

Aspect 30: An artificial intelligence (AI) inference apparatus, including: an integrated circuit (IC) including a current limit detection circuit and one or more artificial intelligence (AI) inference data processing cores; a voltage regulator; an inductor coupled between the voltage regulator and the one or more AI inference data processing cores of the IC; and a current sensing circuit including inputs coupled across the inductor and an output coupled to the current limit detection circuit of the IC.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:

1. An apparatus, comprising:
    an integrated circuit (IC), comprising:
        one or more cores; and
        a current limit detection circuit;
    a voltage regulator;
    an inductor coupled between the voltage regulator and the one or more cores of the IC; and
    a current sensing circuit including inputs coupled across the inductor and an output coupled to the current limit detection circuit of the IC, wherein the current sensing circuit comprises a resistor coupled in series with a capacitor, wherein the resistor and the capacitor are coupled in parallel with the inductor;
    wherein the current limit detection circuit comprises:
        an analog front-end including inputs coupled across the capacitor;
        an analog-to-digital converter (ADC) including an input coupled to an output of the analog front-end;
        a static current detector including an input coupled to the output of the analog front-end;
        a static offset correction circuit including a first input coupled to an output of the static current detector, and a second input coupled to an output of the ADC;
        a digital adder including a first input coupled to the output of the ADC, and a second input coupled to an output of the static offset correction circuit; and
        a current limit violation detection circuit including an input coupled to an output of the digital adder.

2. The apparatus of claim 1, wherein the analog front-end comprises an instrumentation amplifier or a differential amplifier.

3. The apparatus of claim 1, wherein the IC further comprises a current reduction control circuit including an input coupled to an output of the current limit violation detection circuit and an output coupled to the one or more cores.

4. The apparatus of claim 1, wherein the current limit detection circuit further comprises:
    a transient current detector including an input coupled to the output of the analog front-end; and
    a transient offset correction circuit including a first input coupled to an output of the transient current detector and a second input coupled to the output of the ADC;
    wherein the digital adder includes a third input coupled to an output of the transient offset correction circuit.

5. The apparatus of claim 4, wherein the IC further comprises a current reduction control circuit including an input coupled to an output of the current limit violation detection circuit and an output coupled to the one or more cores.

6. The apparatus of claim 1, wherein the current sensing circuit further comprises a resistive device coupled in parallel with the capacitor.

7. The apparatus of claim 6, wherein the resistive device has a temperature coefficient substantially equal in magnitude and opposite in sign as a temperature coefficient of an intrinsic resistance of the inductor.

8. The apparatus of claim 1, wherein the voltage regulator includes a temperature signal output coupled to the current limit detection circuit of the IC.

9. The apparatus of claim 8, wherein the current limit detection circuit further comprises
    a temperature offset correction circuit including an input coupled to the temperature signal output of the voltage regulator;
    wherein the digital adder includes a third input coupled to an output of the temperature offset correction circuit.

10. The apparatus of claim 9, wherein the IC further comprises a current reduction control circuit including an input coupled to an output of the current limit violation detection circuit and an output coupled to the one or more cores.

11. The apparatus of claim 1, further comprising:
    a set of voltage regulators including the voltage regulator;
    a set of inductors including the inductor, wherein the set of inductors are coupled between the set of voltage regulators and the one or more cores of the IC, respectively; and
    a set of current sensing circuits including a set of inputs coupled across the set of inductors, respectively, wherein the set of current sensing circuits includes a set of outputs coupled to the current limit detection circuit of the IC.

12. The apparatus of claim 11, wherein the current limit detection circuit comprises
a voltage summer including inputs coupled to the set of outputs of the set of current sensing circuits;
wherein the inputs of the analog front-end are coupled to an output of the voltage summer.

13. The apparatus of claim 12, wherein the IC further comprises a current reduction control circuit including an input coupled to an output of the current limit violation detection circuit and an output coupled to the one or more cores.

14. The apparatus of claim 1, further comprising:
a set of voltage regulators including the voltage regulator;
a set of inductors including the inductor, wherein the set of inductors are coupled between the set of voltage regulators and the one or more cores of the IC, respectively; and
at least one current sensing circuit including inputs coupled across at least one of the set of inductors, respectively, wherein the at least one current sensing circuit includes at least one output coupled to the current limit detection circuit of the IC.

15. The apparatus of claim 14, wherein:
the inputs of the analog front-end are coupled to the at least one output of the at least one current sensing circuit, respectively;
the current limit detection circuit further comprises a multiplier including a first input coupled to an output of the ADC, and a second input configured to receive a multiplication factor; and
the current limit violation detection circuit includes an input coupled to an output of the multiplier.

16. The apparatus of claim 1, wherein the IC is implemented as a system on chip (SOC) including the one or more cores and the current limit detection circuit, wherein the SOC is mounted on a printed circuit board (PCB), and wherein the voltage regulator, inductor, and current sensing circuit are off-chip components mounted on the PCB.

17. A method, comprising:
sensing a first voltage across an inductor coupled between a voltage regulator and one or more cores of an integrated circuit (IC), wherein sensing the first voltage across the inductor comprises generating a second voltage across a capacitor coupled in series with a resistor, wherein the capacitor and the resistor are coupled in parallel with the inductor;
providing the first voltage to the IC; and
controlling a current flowing through the inductor and to the one or more cores of the IC based on the first voltage, wherein controlling the current comprises:
amplifying the second voltage to generate a current-related voltage;
converting the current-related voltage to a current-related digital signal;
correcting the current-related digital signal for tolerance variation associated with at least one of an intrinsic resistance of the inductor, an intrinsic inductance of the inductor, a resistance of the resistor, and a capacitance of the capacitor;
comparing the corrected current-related digital signal to one or more current limits; and
reducing the current flowing to the one or more cores based on the comparison.

18. The method of claim 17, wherein generating the second voltage across the capacitor comprises setting a first time constant associated with the resistor and capacitor to be substantially the same as a second time constant associated with the inductor.

19. The method of claim 17, further comprising compensating the second voltage for variation of an intrinsic resistance of the inductor with temperature.

20. The method of claim 17, wherein controlling the current further comprises
correcting the current-related digital signal for variation of at least one of the intrinsic resistance of the inductor, the intrinsic inductance of the inductor, the resistance of a resistor, and the capacitance of a capacitor with temperature.

21. An apparatus, comprising:
means for sensing a first voltage across an inductor coupled between a voltage regulator and one or more cores of an integrated circuit (IC), wherein the means for sensing the first voltage across the inductor comprises means for generating a second voltage across a capacitor coupled in series with a resistor, the capacitor and resistor being coupled in parallel with the inductor;
means for providing the first voltage to the IC; and
means for controlling a current flowing through the inductor and to the one or more cores of the IC based on the first voltage, wherein the means for controlling the current comprises:
means for amplifying the second voltage to generate a current-related voltage;
means for converting the current-related voltage to a current-related digital signal;
means for correcting the current-related digital signal for tolerance variation associated with at least one of an intrinsic resistance of the inductor, an intrinsic inductance of the inductor, a resistance of the resistor, and a capacitance of the capacitor;
means for comparing the corrected current-related digital signal to one or more current limits; and
means for reducing the current flowing to the one or more cores based on the comparison.

22. An apparatus, comprising:
an integrated circuit (IC), comprising:
one or more cores; and
a current limit detection circuit;
a voltage regulator;
an inductor coupled between the voltage regulator and the one or more cores of the IC; and
a current sensing circuit including inputs coupled across the inductor and an output coupled to the current limit detection circuit of the IC, wherein the current sensing circuit comprises a resistor coupled in series with a capacitor, wherein the resistor and the capacitor are coupled in parallel with the inductor;
wherein the current limit detection circuit comprises:
an analog front-end including inputs coupled across the capacitor;
an analog-to-digital converter (ADC) including an input coupled to an output of the analog front-end;
a transient current detector including an input coupled to the output of the analog front-end;
a transient offset correction circuit including a first input coupled to an output of the transient current detector and a second input coupled to an output of the ADC;

a digital adder including a first input coupled to the output of the ADC, a second input coupled to an output of the transient offset correction circuit; and a current limit violation detection circuit including an input coupled to an output of the digital adder.

23. The apparatus of claim 22, wherein the IC further comprises a current reduction control circuit including an input coupled to an output of the current limit violation detection circuit and an output coupled to the one or more cores.

* * * * *